(12) United States Patent
Colinge et al.

(10) Patent No.: US 9,570,579 B2
(45) Date of Patent: Feb. 14, 2017

(54) SEMICONDUCTOR STRUCTURES AND METHODS FOR MULTI-LEVEL WORK FUNCTION

(71) Applicant: Taiwan Semiconductor Manufacturing Company Limited, Hsinchu (TW)

(72) Inventors: Jean-Pierre Colinge, Hsinchu (TW); Carlos H. Diaz, Mountain View, CA (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/852,679

(22) Filed: Sep. 14, 2015

(65) Prior Publication Data
US 2015/0380520 A1  Dec. 31, 2015

Related U.S. Application Data

(63) Continuation-in-part of application No. 14/184,094, filed on Feb. 19, 2014, and a continuation-in-part of application No. 14/469,682, filed on Aug. 27, 2014.

(51) Int. Cl.
| | |
|---|---|
| *H01L 29/66* | (2006.01) |
| *H01L 29/78* | (2006.01) |
| *H01L 29/49* | (2006.01) |
| *H01L 29/43* | (2006.01) |
| *H01L 21/28* | (2006.01) |
| *H01L 29/423* | (2006.01) |
| *H01L 29/40* | (2006.01) |

(Continued)

(52) U.S. Cl.
CPC ... *H01L 29/66545* (2013.01); *H01L 21/28079* (2013.01); *H01L 21/28088* (2013.01); *H01L 29/0676* (2013.01); *H01L 29/1045* (2013.01); *H01L 29/401* (2013.01); *H01L 29/4232* (2013.01); *H01L 29/42376* (2013.01); *H01L 29/4958* (2013.01); *H01L 29/4966* (2013.01); *H01L 29/4983* (2013.01); *H01L 29/66439* (2013.01); *H01L 29/775* (2013.01); *H01L 29/78* (2013.01)

(58) Field of Classification Search
CPC .......... H01L 29/4958; H01L 29/66545; H01L 29/775; H01L 29/66439; H01L 29/401; H01L 29/4242; H01L 29/78; H01L 29/66795; H01L 21/823431; H01L 21/845; H01L 27/0924; H01L 27/1211
See application file for complete search history.

(56) References Cited

U.S. PATENT DOCUMENTS

| | | | |
|---|---|---|---|
| 9,299,616 B1 * | 3/2016 | Faul | H01L 21/823437 |
| 2010/0270619 A1 * | 10/2010 | Lee | H01L 29/4908 257/365 |
| 2014/0264640 A1 * | 9/2014 | Nieh | H01L 29/4966 257/412 |

* cited by examiner

*Primary Examiner* — Thanhha Pham
(74) *Attorney, Agent, or Firm* — Jones Day

(57) ABSTRACT

Semiconductor devices that each include a channel region and a gate stack are disclosed. The gate stack includes a gate insulator, a pair of spaced apart first metal gate layers, and a second metal gate layer. The gate insulator extends along the length of the channel region. The first metal gate layers have a first workfunction and extend from the gate insulator. The second metal gate layer is disposed between the first metal gate layers, has a second workfunction different from the first workfunction, and extends from the gate insulator. Methods of fabricating the gate stack are also disclosed.

11 Claims, 32 Drawing Sheets

(51) Int. Cl.
*H01L 29/775* (2006.01)
*H01L 29/06* (2006.01)
*H01L 29/10* (2006.01)

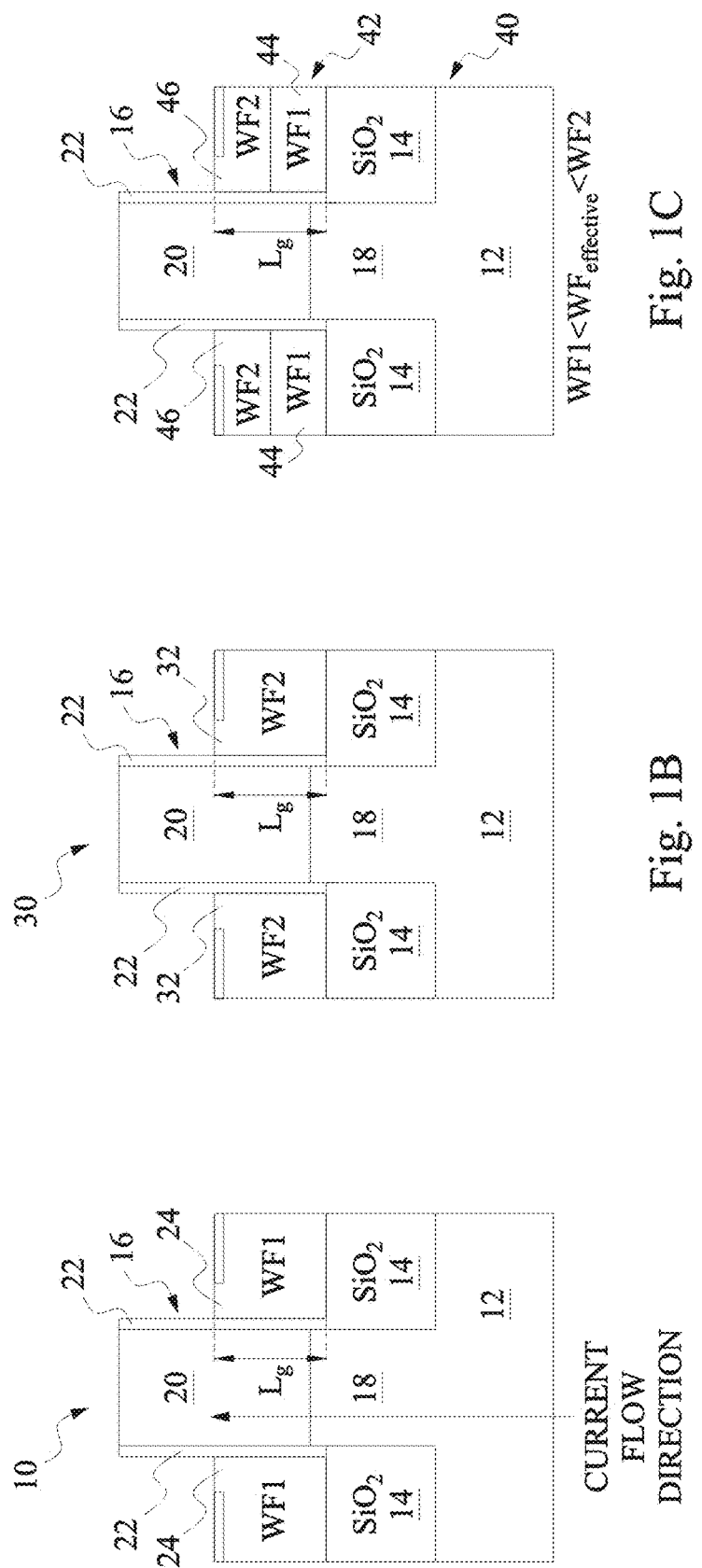

FRACTION OF GATE LENGTH COVERED BY WF2 METAL

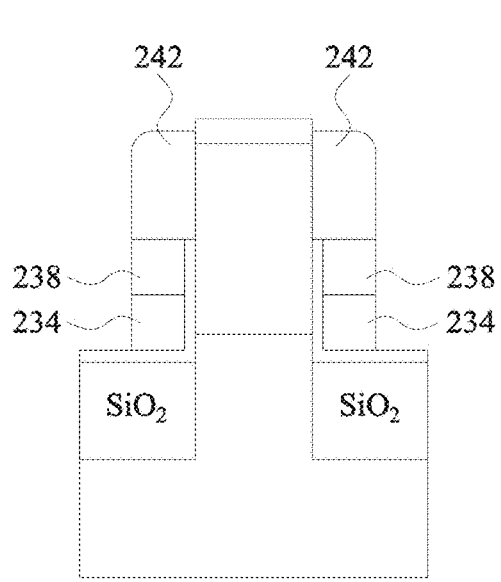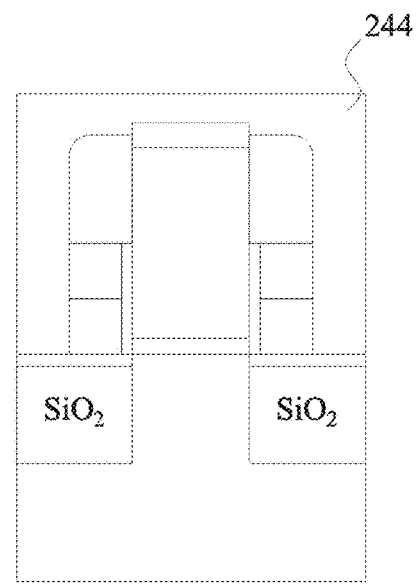
Fig. 7G                    Fig. 7H
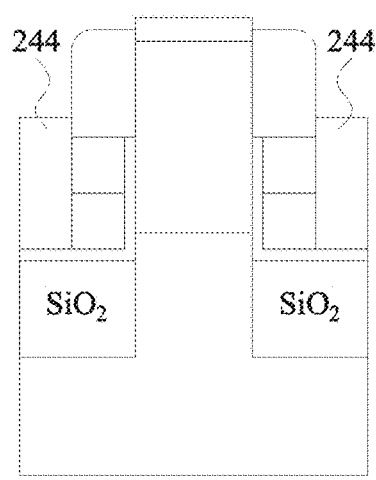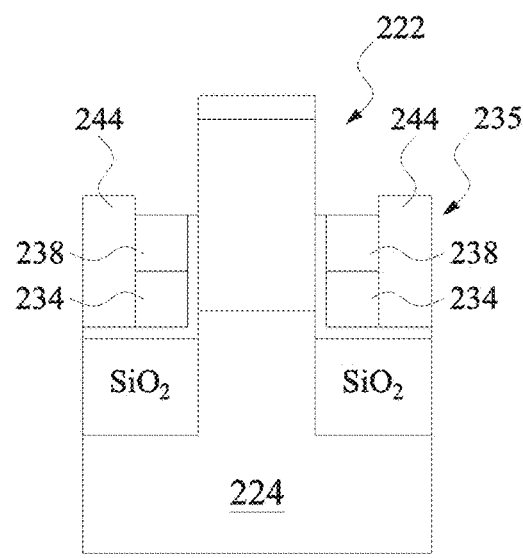
Fig. 7I                    Fig. 7J

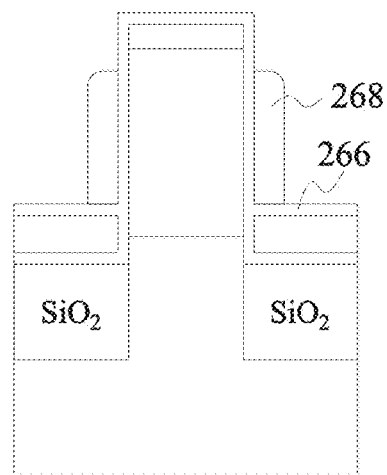
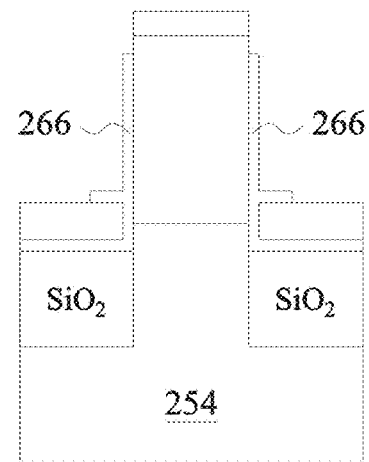
Fig. 9E
Fig. 9F
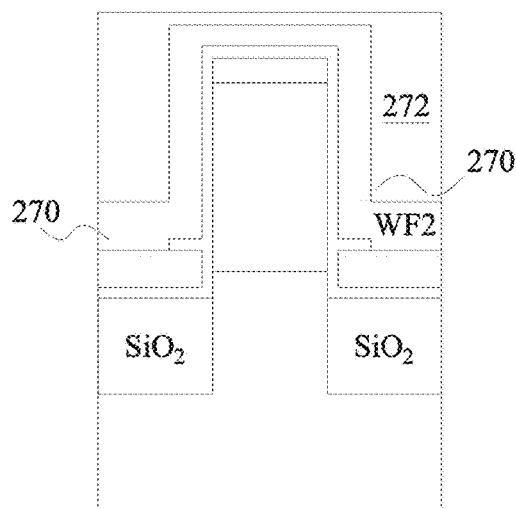
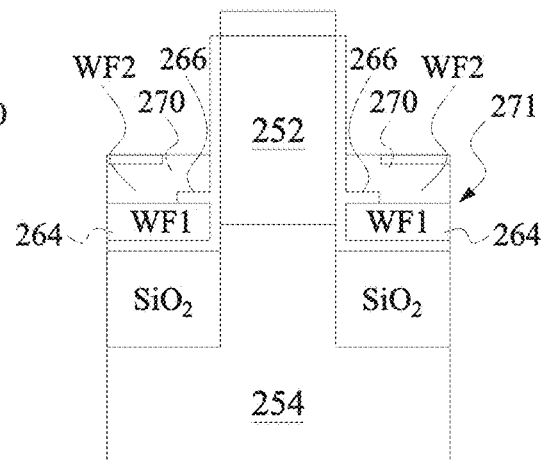
Fig. 9G
Fig. 9H

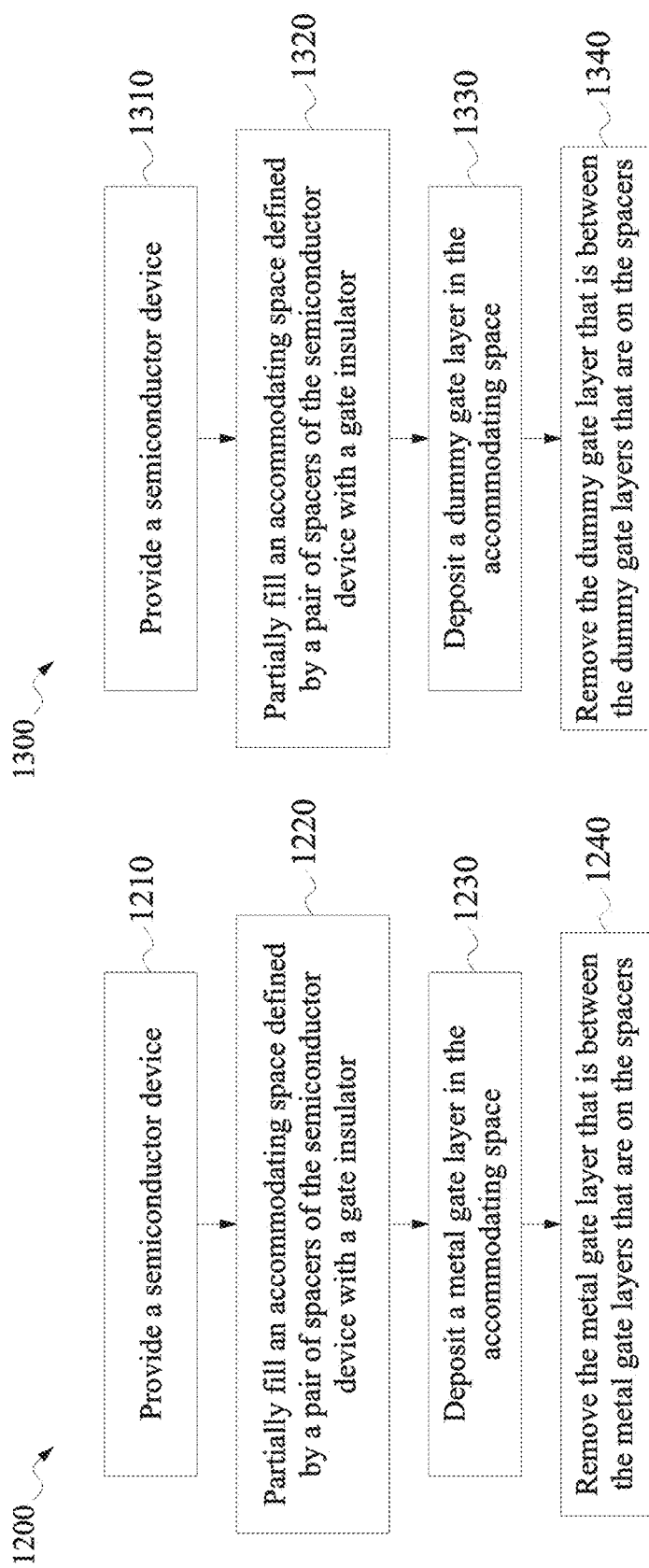

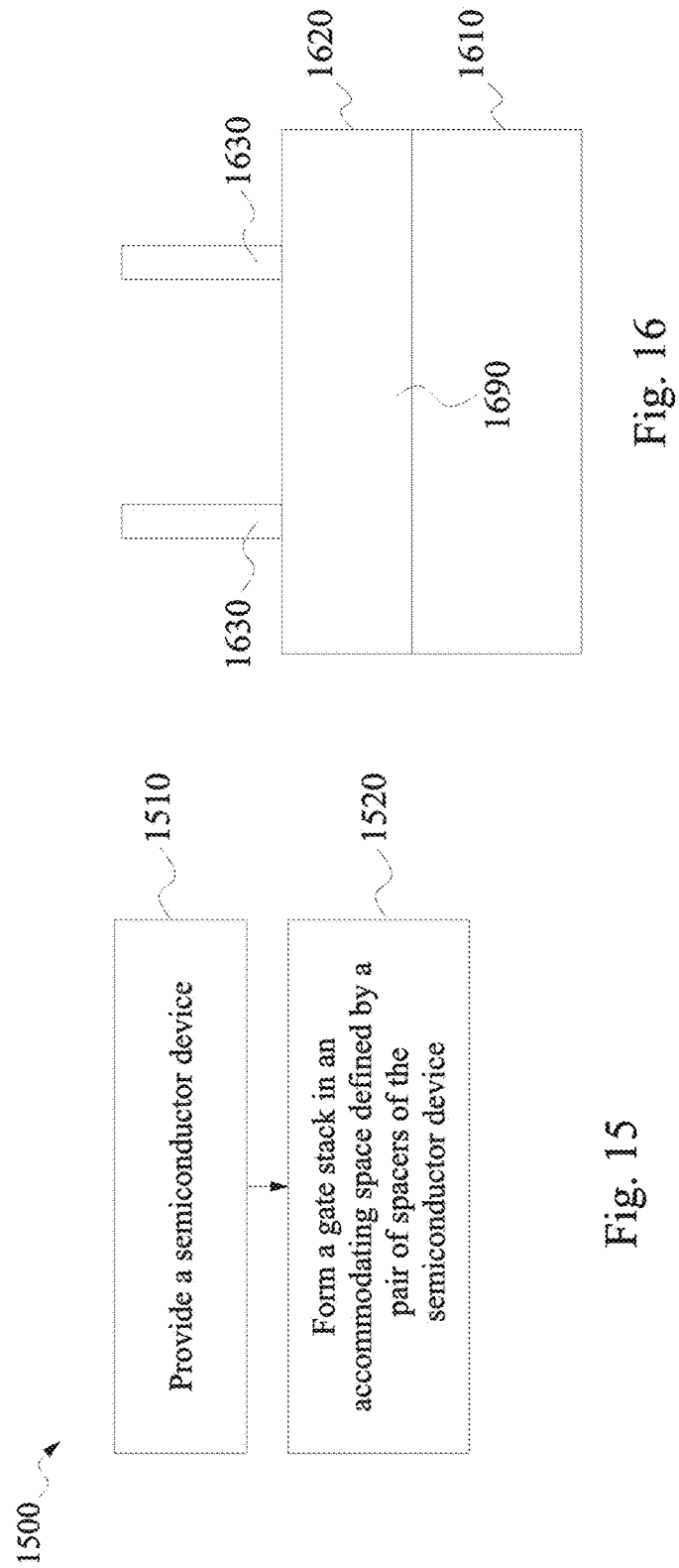

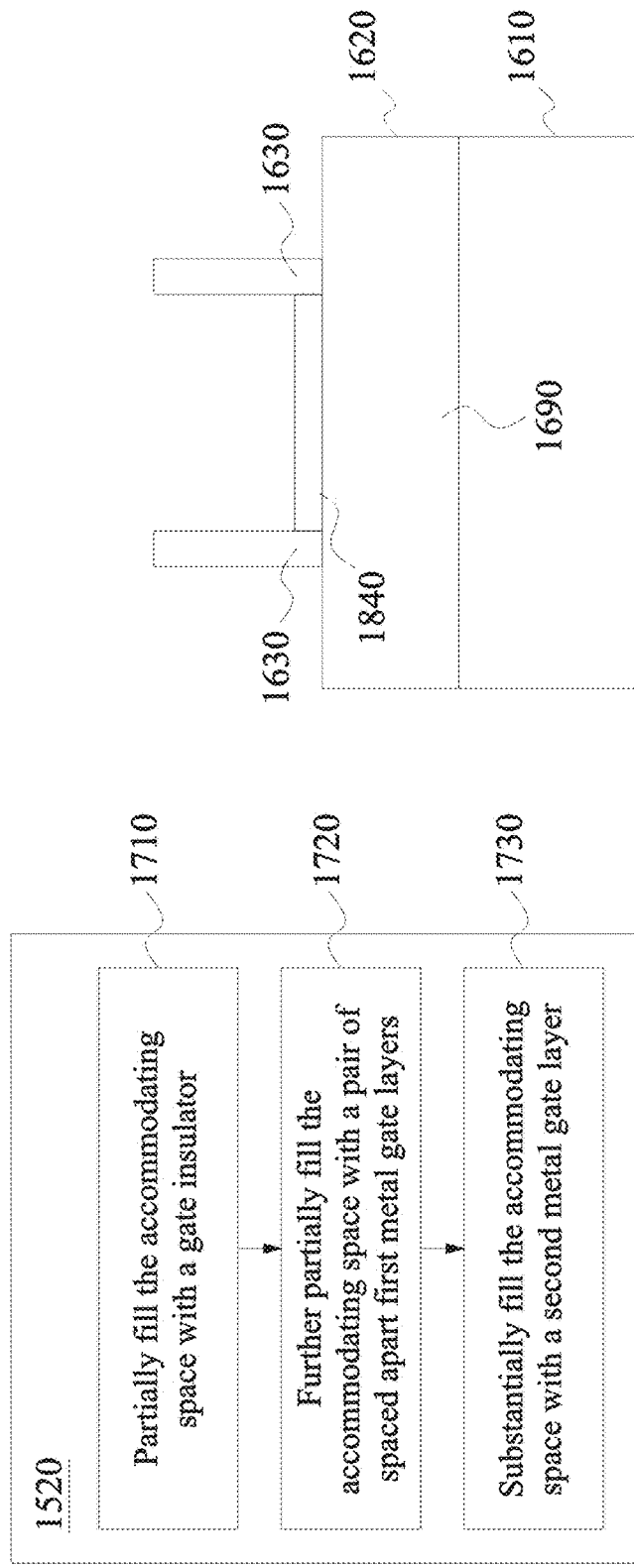

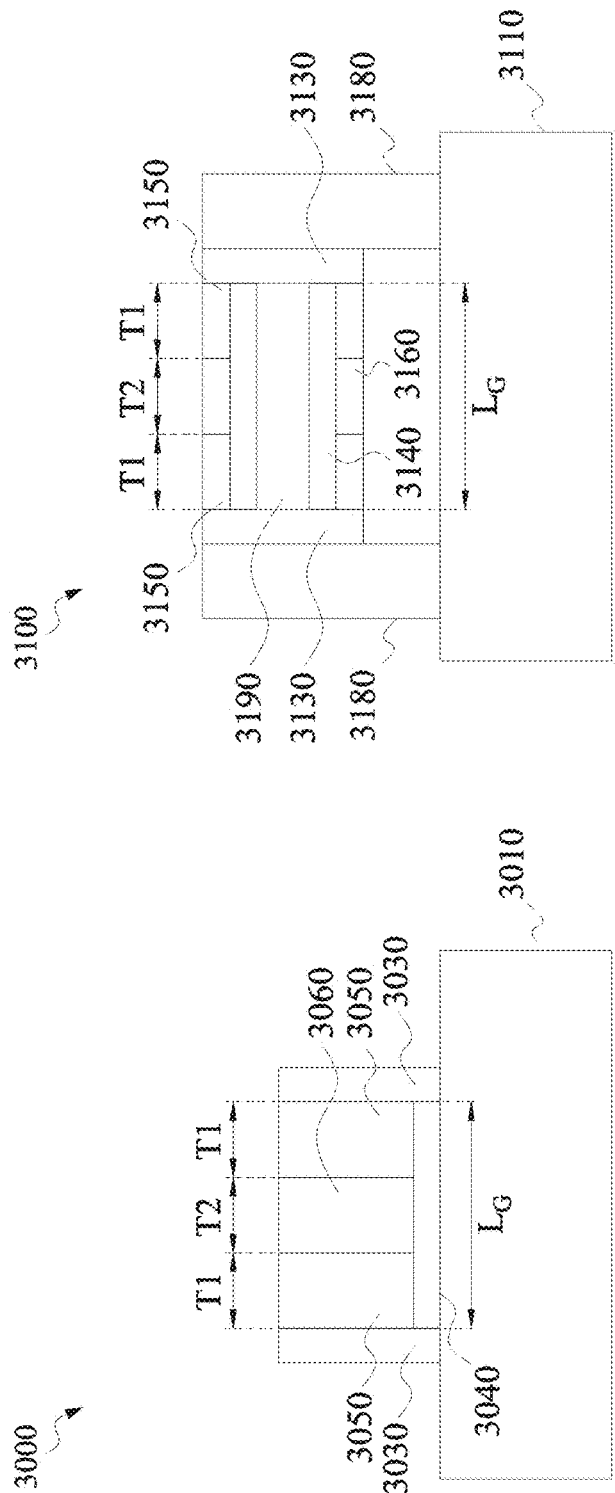

SEMICONDUCTOR STRUCTURES AND METHODS FOR MULTI-LEVEL WORK FUNCTION

CROSS-REFERENCE TO RELATED APPLICATIONS

The present application is a continuation-in-part of U.S. patent application Ser. No. 14/184,094, filed on Feb. 19, 2014, entitled "Semiconductor Structures And Methods For Multi-Level Work Function And Multi-Valued Channel Doping Of Nanowire Transistors To Improve Drive Current," which is hereby incorporated into the present application by reference, and is a continuation-in-part of U.S. patent application Ser. No. 14/469,682, filed on Aug. 27, 2014, entitled "Semiconductor Structures and Methods For Multi-Level Work Function," which is also hereby incorporated into the present application by reference.

BACKGROUND

The technology described in this patent document relates generally to semiconductor devices and more particularly to vertical/horizontal channel semiconductor devices.

Scaling of semiconductor devices, such as a metal-oxide semiconductor field-effect transistor (MOSFET), has enabled continued improvement in speed, performance, density, and cost per unit function of integrated circuits over the past few decades. Improvements to vertical/horizontal channel devices can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, and 1C are diagrams illustrating cross-sectional views of example semiconductor devices in accordance with some embodiments.

FIGS. 7A-7J are drawings depicting example states of a semiconductor structure during fabrication thereof in accordance with some embodiments.

FIGS. 9A-9H are drawings depicting example states of a semiconductor structure during fabrication thereof in accordance with some embodiments.

FIG. 12 is a process flow chart illustrating an example method of fabricating a gate stack of a semiconductor device in accordance with some embodiments.

FIG. 13 is a process flow chart illustrating an example method of fabricating a gate stack of a semiconductor device in accordance with some embodiments.

FIG. 15 is a process flow chart illustrating an example method of fabricating a gate stack of a semiconductor device in accordance with some embodiments.

FIG. 16 is a drawing depicting an example state of a semiconductor device during fabrication of a gate stack thereof in accordance with some embodiments.

FIG. 17 is a process flow chart illustrating operation 1520 of FIG. 15 in accordance with some embodiments.

FIG. 18 is a drawing depicting an example state of a semiconductor device during fabrication of a gate stack thereof in accordance with some embodiments.

FIG. 30 is a diagram illustrating a cross-sectional view of an example semiconductor device in accordance with some embodiments.

FIG. 31 is a diagram illustrating a cross-sectional view of an example semiconductor device in accordance with some embodiments.

DETAILED DESCRIPTION

Figure 2A:
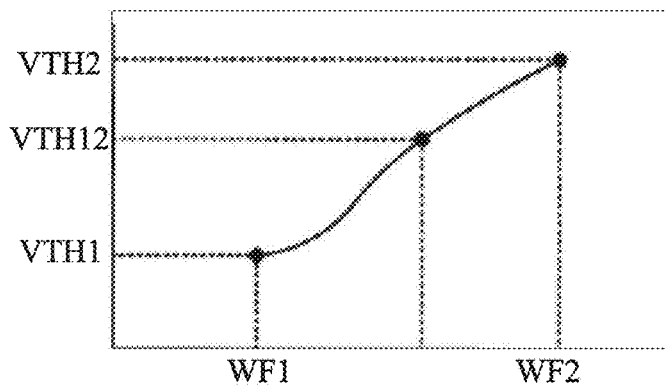
FIGS. 2A, 2B, and 2C are diagrams illustrating that the percentage of gate length occupied by different metal layers in a metal gate can be configured to set a threshold voltage level for a device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a diagram illustrating a cross-sectional view of the channel region of an example vertical-gate-all-around (VGAA) semiconductor device 10. The example VGAA device 10 includes a substrate 12, a dielectric layer 14 comprising $SiO_2$ in this example above the substrate 12, and a vertical channel region 16 comprising a substrate section 18 and a vertical channel section 20. The vertical channel section 20 in this example is formed using nanowire technology. The example VGAA device 10 also includes a gate insulator 22, such as a high-k dielectric gate insulator, and a gate metal layer 24 of length $L_G$. The gate metal layer 24 has a first workfunction level WF1. The workfunction level WF1 of the metal gate layer 24 will affect the threshold voltage level of the VGAA device 10.

FIG. 1B is a diagram illustrating a cross-sectional view of the channel region of another example vertical-gate-all-around (VGAA) semiconductor device 30. The example VGAA device 30 is similar to the example VGAA device 10 of FIG. 1A and also includes a substrate 12, an oxide layer 14 comprising $SiO_2$, a vertical channel region 16 comprising a substrate section 18 and a vertical channel section 20, and a gate insulator 22. The example VGAA device 30 includes a gate metal layer 32 also of length $L_G$ that has a second workfunction level WF2 that is different from the first workfunction level WF1. The second workfunction level WF2 of the metal gate layer 32 will cause the threshold voltage level of the VGAA device 30 to differ from that of the VGAA device 10.

FIG. 1C is a diagram illustrating a cross-sectional view of the channel region of yet another example vertical-gate-all-around (VGAA) semiconductor device 40. The example VGAA device 40 is similar to the example VGAA device 10 of FIG. 1A and the example VGAA device 30 of FIG. 1B. The example VGAA device 40 also includes a substrate 12, an oxide layer 14 comprising $SiO_2$, a vertical channel region 16 comprising a substrate section 18 and a vertical channel section 20, and a gate insulator 22. The example VGAA device 40 includes a gate metal layer 42 also of length $L_G$ that has a first workfunction WF1 section 44 and a second workfunction WF2 section 46. The combination of the first workfunction WF1 section 44 and the second workfunction WF2 section 46 in the metal gate layer 42 will cause the threshold voltage level of the VGAA device 40 to fall between the threshold voltage level of the VGAA device 10 and the threshold voltage level of the VGAA device 30.

Figure 2B:
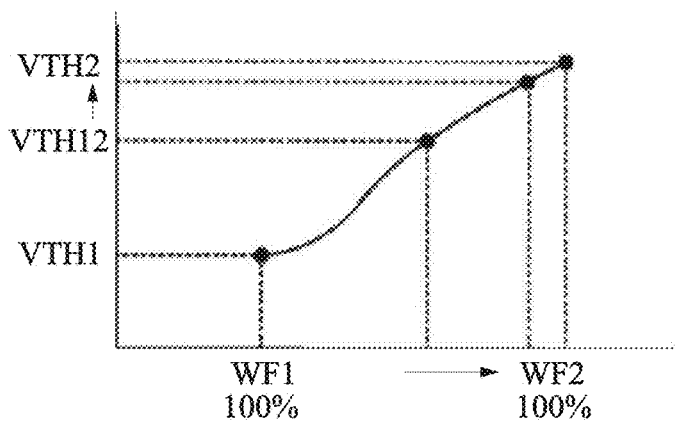

If the VGAA device 10, the VGAA device 30, and the VGAA device 40 are N-channel transistors, the threshold voltage (VTH) increases with the value of the metal workfunction. If the WF2 level is greater than the WF1 level, then the threshold voltage (VTH2) of a device with the WF2 level is higher than the threshold voltage (VTH1) of a device with the WF1 level as illustrated in the graph of FIG. 2A. Also, as illustrated in FIG. 2A, a device with a WF1/WF2 stack (and gate length $L_G$) will have a threshold voltage VTH12 between VTH1 and VTH2. FIG. 2B is a line graph illustrating that by increasing the thickness of WF2 metal (and thus reducing accordingly the thickness of metal WF1 to keep $L_G$ constant ($L_G$=thickness of WF1+thickness of WF2)), the threshold voltage may increase monotonically from VTH1 to VTH2.

Figure 2C:
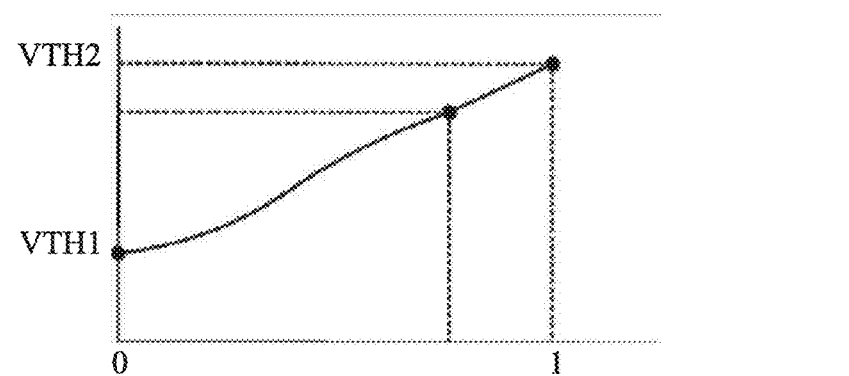

FIG. 2C is a line graph illustrating that the percentage of gate length occupied by WF1 and WF2 can be configured to set a threshold voltage for a device between VTH1 and VTH2. If x is defined as the percentage of gate length $L_G$ covered by WF2, the thickness of WF2=x $L_G$ and the thickness of WF1=(1−x) $L_G$. If x=0, the gate is 100% made of metal WF1 and the threshold voltage is VTH1. If x=1, the gate is 100% made of metal WF2 and the threshold voltage is VTH2. Finally, if 0<x<1 the threshold voltage is between VTH1 and VTH2.

Figure 3:
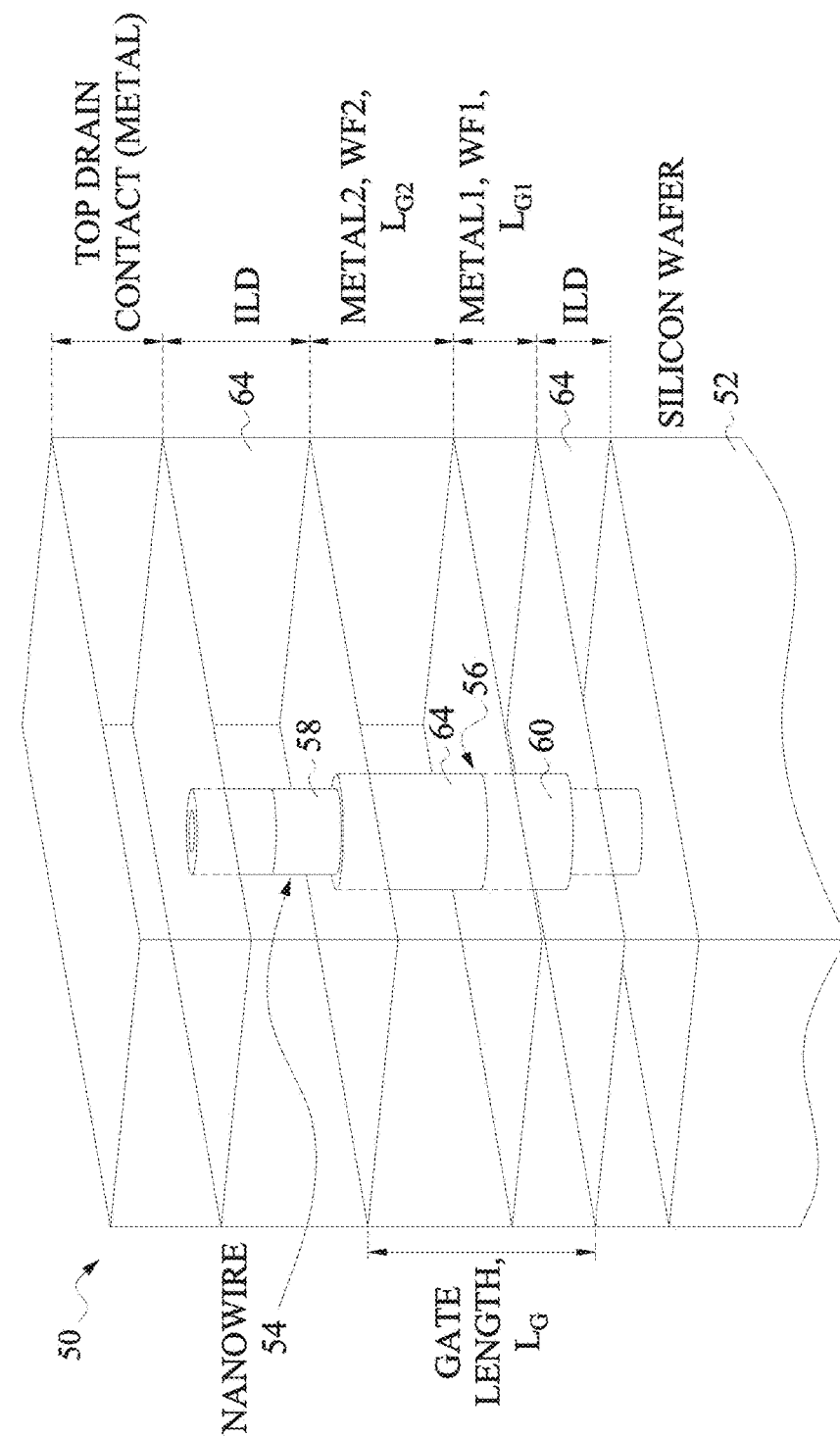
FIG. 3 is a block diagram of an example semiconductor device in accordance with some embodiments.

FIG. 3 is a block diagram of an example semiconductor device 50 that is formed using nanowire technology. The device 50 is fabricated on a substrate 52. In this example, the substrate 52 comprises a bulk substrate, although other substrate structures such as silicon-on-insulator (SOI) may be used. In some embodiments the bulk substrate can include an elementary semiconductor including silicon or germanium in crystal, polycrystalline, or an amorphous structure; a compound semiconductor including silicon carbide, gallium arsenide, gallium phosphide, indium phosphide, indium arsenide, and indium antimonide; an alloy semiconductor including SiGe, SiGeSn, GeSn, GaAsP, AlInAs, AlGaAs, GaInAs, GaInP, and GaInAsP; any other suitable material; a semimetal element that becomes semiconducting once in a nanowire form, such as bismuth or tin; or combinations thereof. In some embodiments the bulk substrate can include p-type material and in other embodiments the bulk substrate can include n-type material. The substrate 52 may include isolation regions, doped regions, and/or other features.

The example semiconductor device 50 further includes a source region (not shown) in the substrate 52, one or more nanowire structures 54, and gate material 56 of length $L_G$ above the substrate and surrounding a middle portion of the nanowire structures 54. The nanowire structures 54 in this example are oriented in a vertical direction and extend upwardly from the source region. In other examples, the nanowire structures may extend in other directions such as a horizontal direction. Also, although nanowires with a circular cross-sectional shape are shown in this example, in other examples the cross-sectional shape may include circular, square, rectangular, triangular, trapezoidal, or other shapes. The example nanowire structure 54 comprises semiconductor material such as silicon that is used to form a channel region between the source region and a drain region (not shown). The drain region in this example is at the far end section of the nanowire structure 54 opposite the source region. Gate oxide 58 is also shown surrounding the nanowire structure 54 and sandwiched between the gate material 56 and the nanowire structure 54. The gate material 56 in this example comprises a first gate metal section 60 with a first workfunction level and a first thickness and a second gate metal section 62 with a second workfunction level and a second thickness. The example semiconductor device 50 further includes insulation material (ILD) 64 above the substrate 52 and surrounding the nanowire structures 54.

Figure 4:
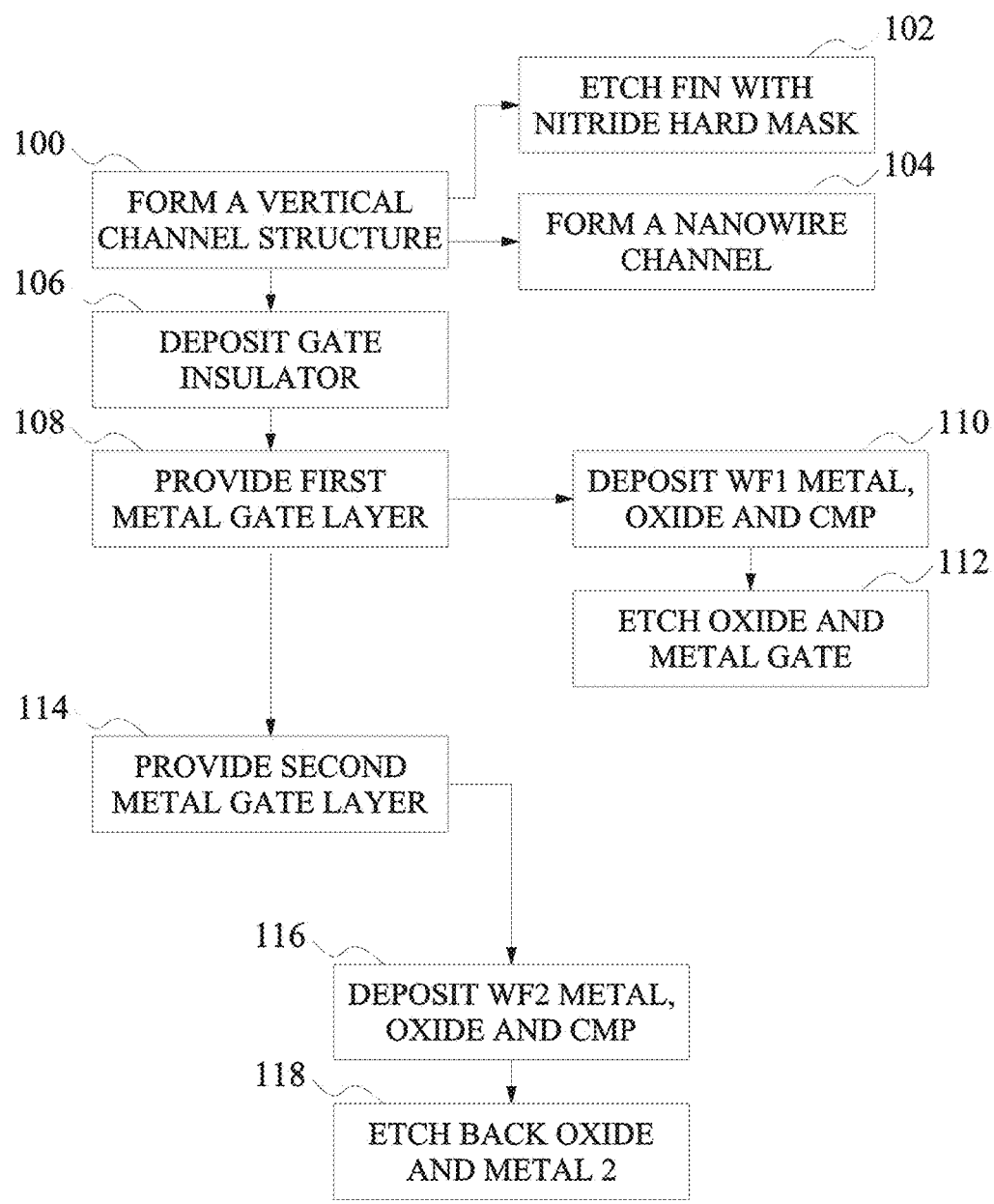
FIG. 4 is a process flow chart illustrating an example method of fabricating a semiconductor device in accordance with some embodiments.
Figure 5C:
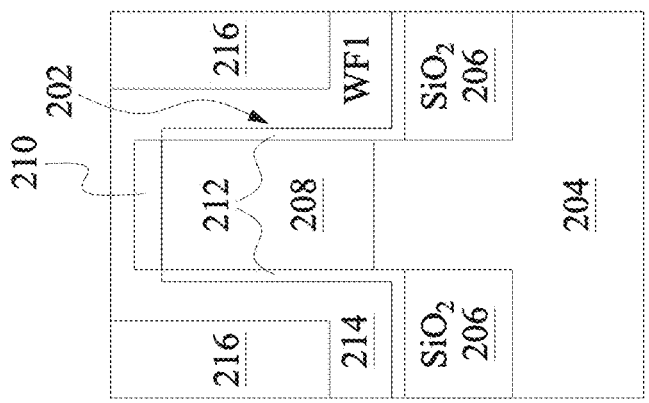
FIGS. 5A-5F are drawings depicting example states of a semiconductor structure during fabrication thereof in accordance with some embodiments.
Figure 5B:
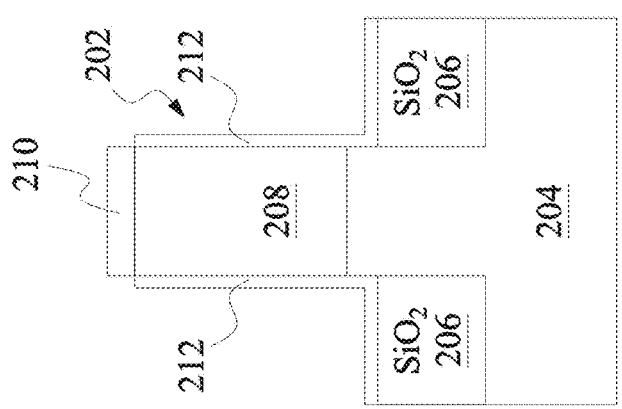
Figure 5A:
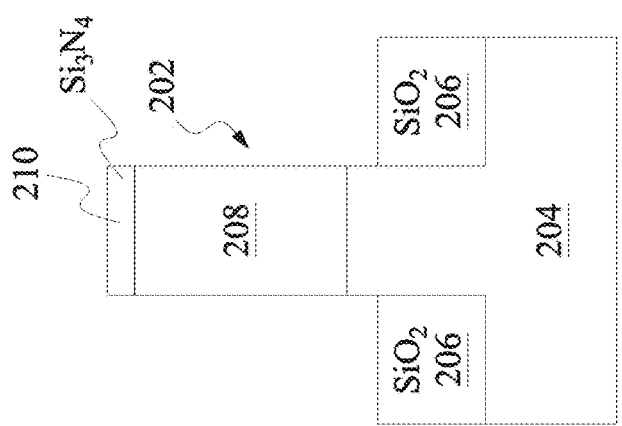

FIG. 4 is a process flow chart illustrating an example method of fabricating a semiconductor device having multiple gate sections with different workfunction levels. A vertical channel structure extending from a substrate and formed as a channel between a source region and a drain region is formed (operation 100). The vertical channel structure may comprise various structures such as a fin that was etched from the substrate (option 102) and/or a nanowire that was grown above the substrate (option 104). FIG. 5A provides a cross-sectional view of an example semiconductor structure after forming a vertical channel structure 202 on a substrate 204 with an oxide region 206 by etching a fin 208 with a nitride hard mask 210, although other hard mask materials such as silicon-carbon nitride (SiCN) may be used.

Referring back to FIG. 4, after forming a vertical channel structure, a gate insulator is deposited above the oxide region and around the vertical channel structure (operation 106). FIG. 5B provides a cross-sectional view of an example semiconductor structure after a gate insulator 212 has been deposited above the oxide region 206 and around the vertical channel structure 202.

Referring back to FIG. 4, after depositing a gate insulator, a first metal gate layer is provided (operation 108). Providing a first metal gate layer may comprise depositing a first metal layer having a first workfunction level followed by depositing an oxide layer, and further followed by chemical mechanical polishing (CMP) operations (operation 110). The first metal layer and oxide layer may then be etched to leave a first metal layer having a first thickness level (operation 112). FIG. 5C provides a cross-sectional view of an example semiconductor structure after a first metal layer 214 and oxide 216 have been deposited. FIG. 5D provides a cross-sectional view of an example semiconductor structure after etching the first metal layer 214 and oxide to the first thickness level.

Referring back to FIG. 4, after providing a first metal gate layer, a second metal gate layer is provided (operation 114). Providing a second metal gate layer may comprise depositing a second metal layer having a second workfunction level followed by depositing an oxide layer, and further followed by chemical mechanical polishing (CMP) operations (operation 116). The second metal layer and oxide layer may then be etched to leave a second metal layer having a second thickness level (operation 118). The first thickness level and the second thickness level can be chosen to produce a metal gate having a desired gate length. FIG. 5E provides a cross-sectional view of an example semiconductor structure after a second metal layer 218 and oxide 220 have been deposited.

Figure 5F:
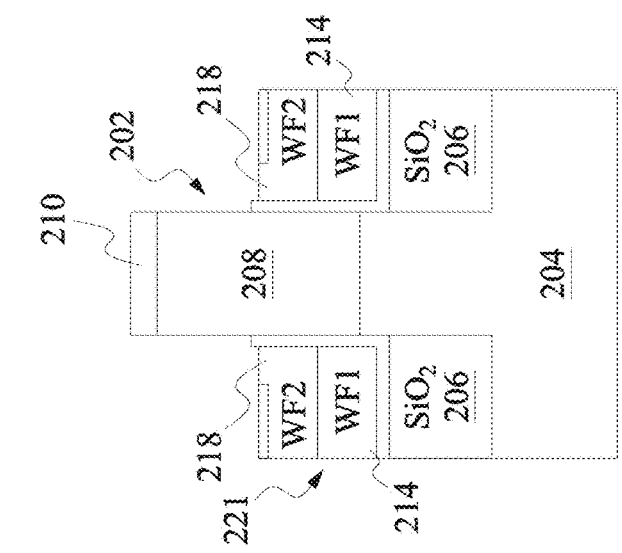
Figure 5E:
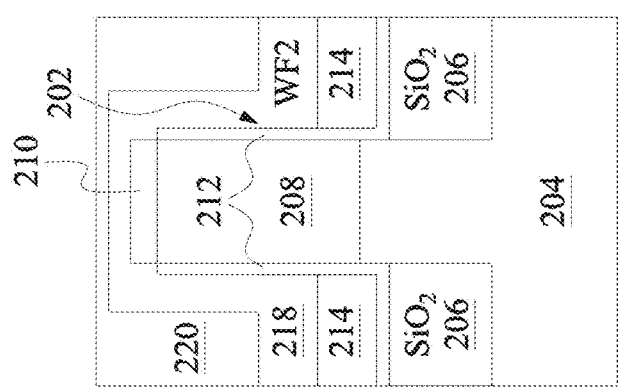
Figure 5D:
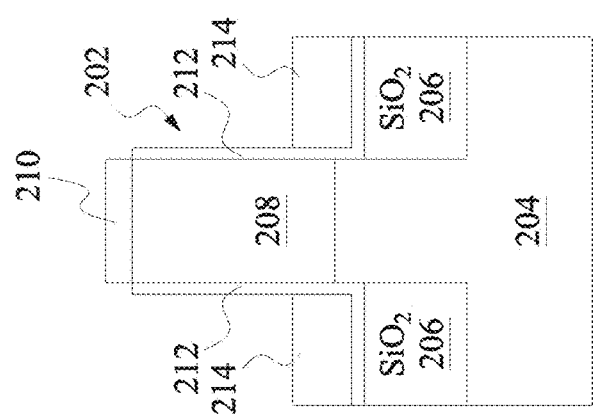

FIG. 5F provides a cross-sectional view of an example semiconductor structure after etching the second metal layer 218 and oxide 220 to the second thickness level. Shown is a semiconductor structure comprising a vertical channel structure 202 extending from a substrate 204 and formed as a channel between a source region and a drain region. The semiconductor structure further comprises a metal gate 221 that surrounds a portion of the vertical channel structure 202. The metal gate 221 has a gate length. The metal gate 221 has a first gate section 214 with a first workfunction and a first thickness. The metal gate also has a second gate section 218 with a second workfunction and a second thickness. The first thickness level may be different from the second thickness level and the sum of the first thickness level and the second thickness level is equal to the gate length. The ratio of the first thickness level to the second thickness level for the gate length can be chosen to achieve a particular threshold voltage level for the semiconductor device.

Figure 6:
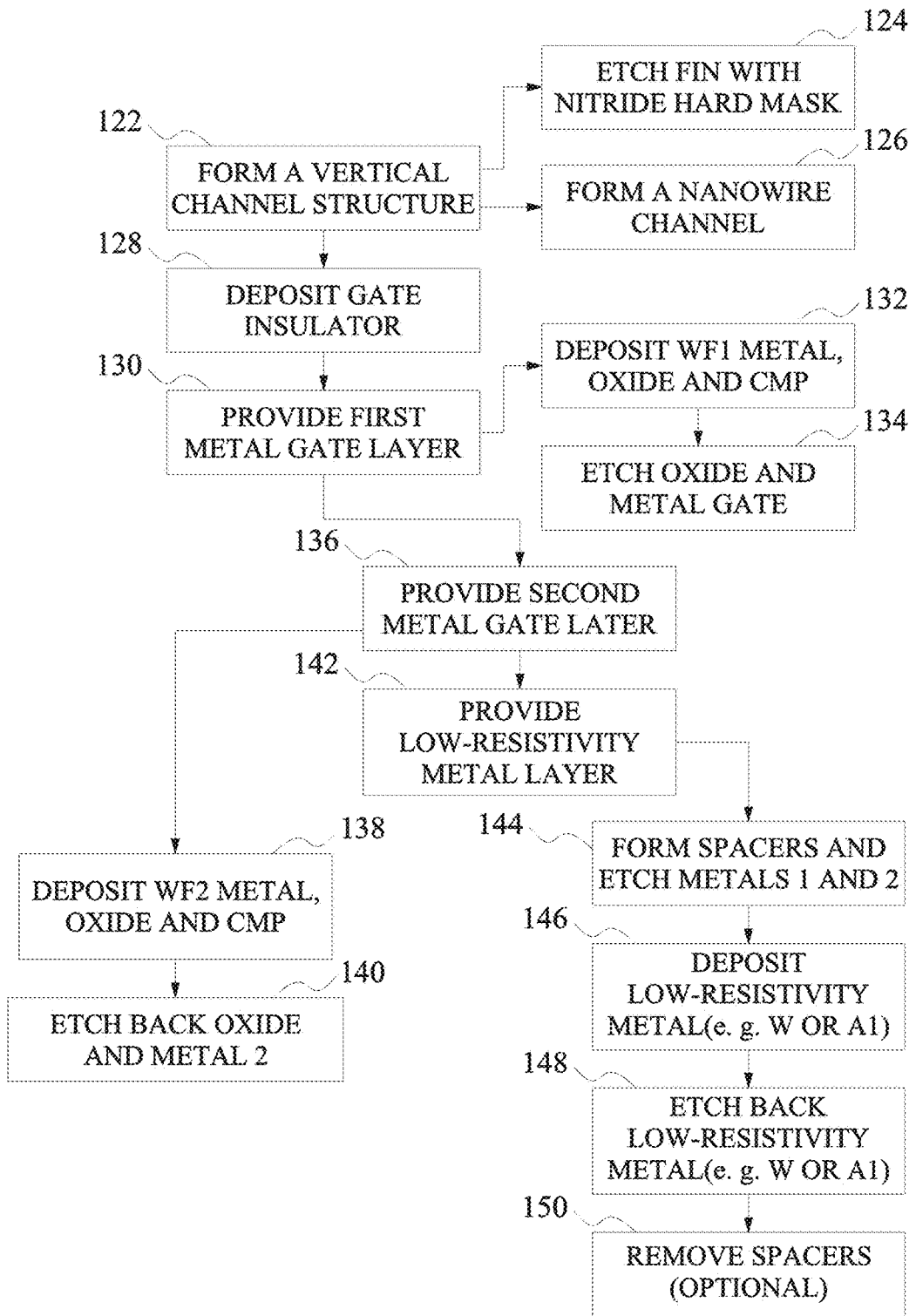
FIG. 6 is a process flow chart illustrating an example method of fabricating a semiconductor device in accordance with some embodiments.
Figure 7A:
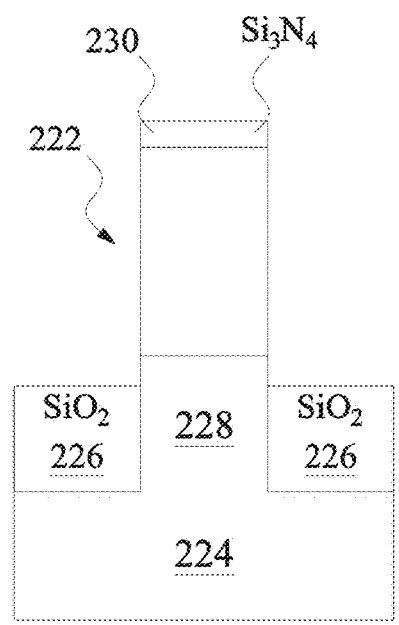

FIG. 6 is a process flow chart illustrating another example method of fabricating a semiconductor device having multiple gate sections with different workfunction levels. A vertical channel structure extending from a substrate and formed as a channel between a source region and a drain region is formed (operation 122). The vertical channel structure may comprise various structures such as a fin that was etched from the substrate (option 124) and/or a nanowire that was grown above the substrate (option 126). FIG. 7A provides a cross-sectional view of an example semiconductor structure after forming a vertical channel structure 222 on a substrate 224 with an oxide region 226 by etching a fin 228 with a nitride hard mask 230, although other hard mask materials such as silicon-carbon nitride (SiCN) may be used.

Figure 7B:
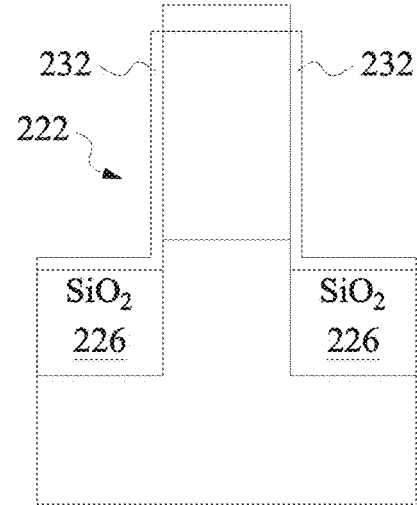

Referring back to FIG. 6, after forming a vertical channel structure, a gate insulator is deposited above the oxide region and around the vertical channel structure (operation 128). FIG. 7B provides a cross-sectional view of an example semiconductor structure after a gate insulator 232 has been deposited above the oxide region 226 and around the vertical channel structure 222.

Figure 7C:
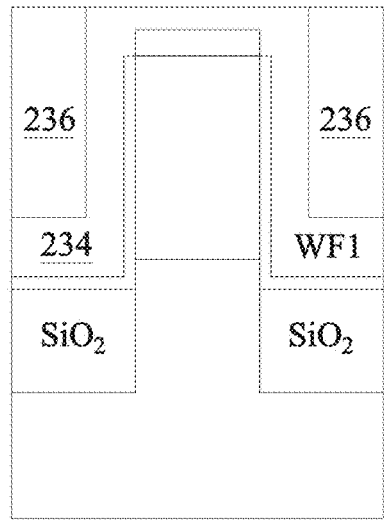
Figure 7D:
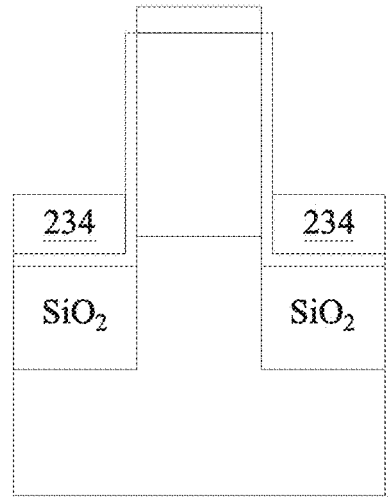

Referring back to FIG. 6, after depositing a gate insulator, a first metal gate layer is provided (operation 130). Providing a first metal gate layer may comprise depositing a first metal layer having a first workfunction level followed by depositing an oxide layer, and further followed by chemical mechanical polishing (CMP) operations (operation 132). The first metal layer and oxide layer may then be etched to leave a first metal layer having a first thickness level (operation 134). FIG. 7C provides a cross-sectional view of an example semiconductor structure after a first metal gate layer 234 and oxide 236 have been deposited. FIG. 7D provides a cross-sectional view of an example semiconductor structure after etching the first metal gate layer 234 and oxide to the first thickness level.

Figure 7E:
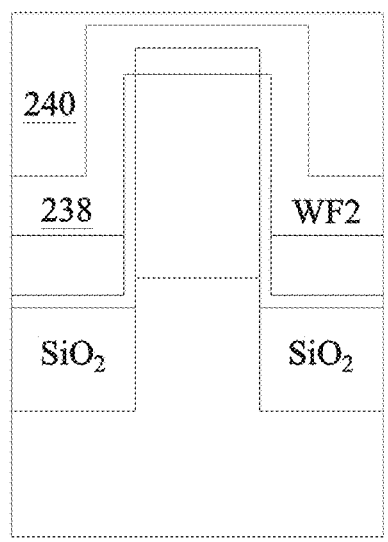
Figure 7F:
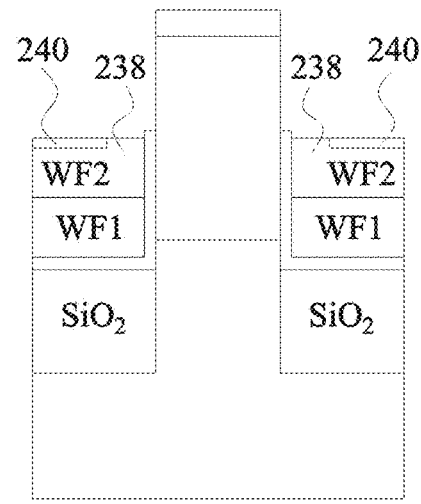

Referring back to FIG. 6, after providing a first metal gate layer, a second metal gate layer is provided (operation 136). Providing a second metal gate layer may comprise depositing a second metal layer having a second workfunction level followed by depositing an oxide layer, and further followed by chemical mechanical polishing (CMP) operations (operation 138). The second metal layer and oxide layer may then be etched to leave a second metal layer having a second thickness level (operation 140). The first thickness level and the second thickness level can be chosen to produce a metal gate having a desired gate length. FIG. 7E provides a cross-sectional view of an example semiconductor structure after a second metal layer 238 and oxide 240 have been deposited. FIG. 7F provides a cross-sectional view of an example semiconductor structure after etching the second metal layer 238 and oxide 240 to the second thickness level.

Referring back to FIG. 6, a low resistivity metal layer can be provided around the first workfunction metal layer and the second workfunction metal layer stack (operation 142). This may comprise forming a spacer and etching back the first workfunction metal layer and the second workfunction metal layer stack (operation 144). Next, low resistivity metal, such as W or Al, may be deposited (operation 146). The low resistivity metal may be etched back to the desired height (operation 148). Finally, the spacers may be optionally removed (operation 150).

FIG. 7G provides a cross-sectional view of an example semiconductor structure after forming a spacer 242 and etching back the first workfunction metal layer 234 and the second workfunction metal layer 238. FIG. 7H provides a cross-sectional view of an example semiconductor structure after depositing a low resistivity metal 244, such as W or Al. FIG. 7I provides a cross-sectional view of an example semiconductor structure after the low resistivity metal 244 has been etched back to the desired height.

FIG. 7J provides a cross-sectional view of an example semiconductor structure after removing the spacers. Shown is a semiconductor structure comprising a vertical channel structure 222 extending from a substrate 224 and formed as a channel between a source region and a drain region. The semiconductor structure further comprises a metal gate 235 that surrounds a portion of the vertical channel structure. The metal gate 235 has a gate length. The metal gate 235 has a first gate section 234 with a first workfunction and a first thickness. The metal gate 235 also has a second gate section 238 with a second workfunction and a second thickness. The first thickness level may be different from the second thickness level and the sum of the first thickness level and the second thickness level is equal to the gate length. The ratio of the first thickness level to the second thickness level for the gate length can be chosen to achieve a particular threshold voltage level for the semiconductor device. The metal gate 235 further comprises low resistivity metal 244 surrounding the first metal gate section 234 and the second metal gate section 238.

Figure 8:
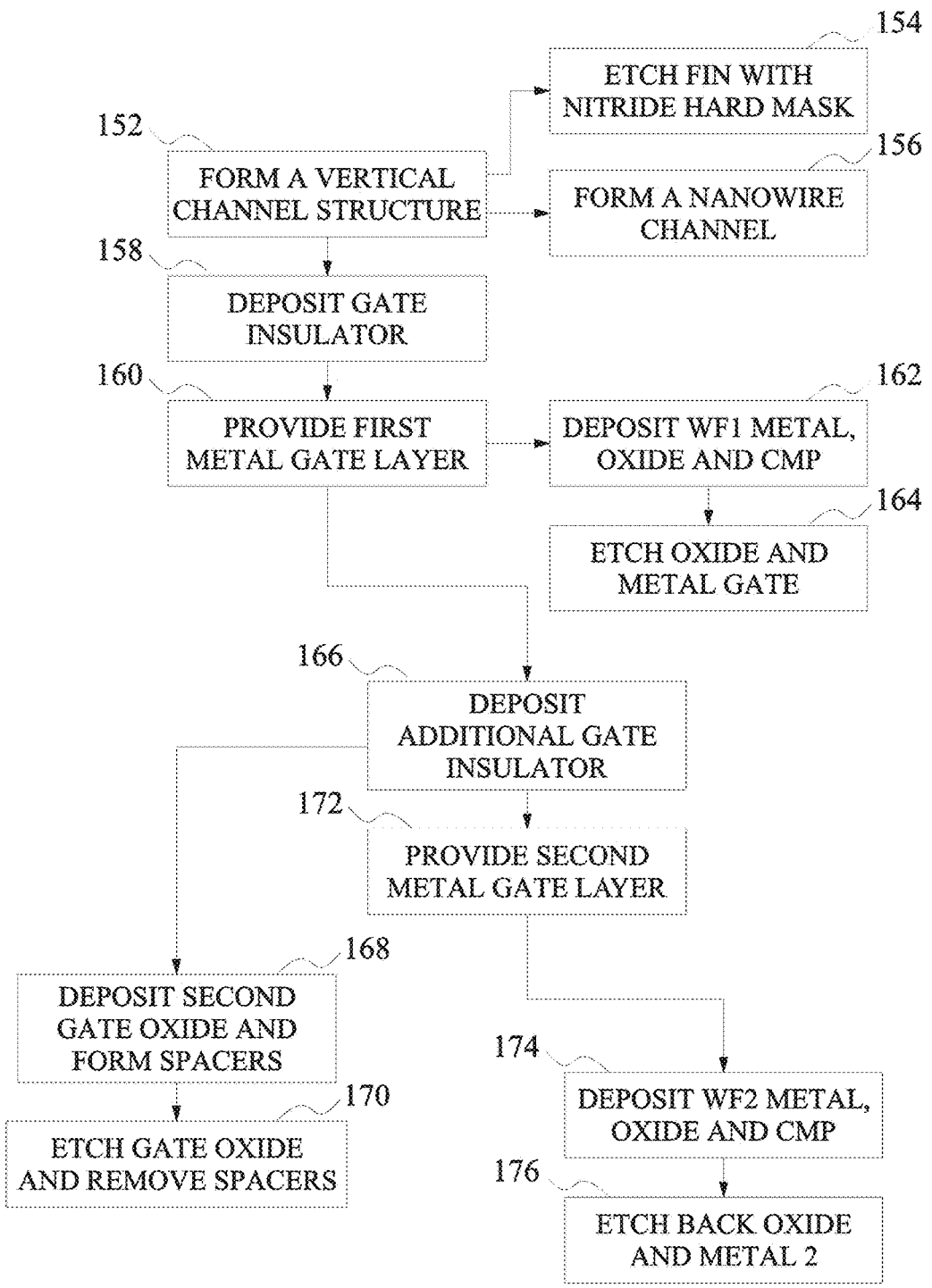
FIG. 8 is a process flow chart illustrating an example method of fabricating a semiconductor device in accordance with some embodiments.
Figure 9A:
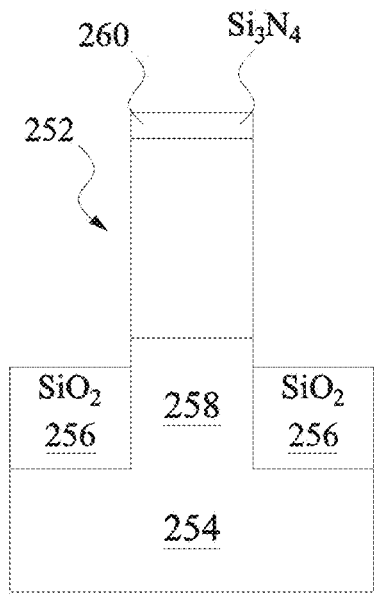

FIG. 8 is a process flow chart illustrating another example method of fabricating a semiconductor device having multiple gate sections with different workfunction levels. A vertical channel structure extending from a substrate and formed as a channel between a source region and a drain region is formed (operation 152). The vertical channel structure may be various structures such as a fin that was etched from the substrate (option 154) and/or a nanowire that was grown above the substrate (option 156). FIG. 9A provides a cross-sectional view of an example semiconductor structure after forming a vertical channel structure 252 on a substrate 254 with an oxide region 256 by etching a fin 258 with a nitride hard mask 260, although other hard mask materials such as silicon-carbon nitride (SiCN) may be used.

Figure 9B:
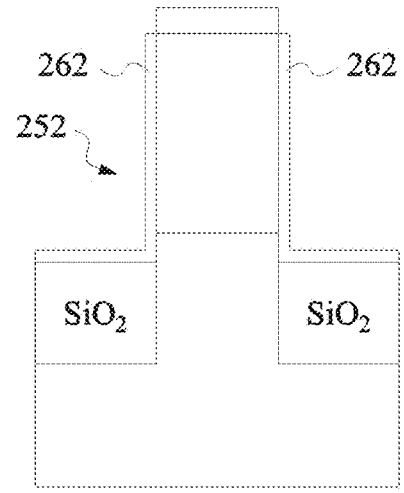

Referring back to FIG. 8, after forming a vertical channel structure, a gate insulator is deposited above the oxide region and around the vertical channel structure (operation 158). FIG. 9B provides a cross-sectional view of an example semiconductor structure after a gate insulator 262 is deposited above the oxide region 256 and around the vertical channel structure 252.

Figure 9C:
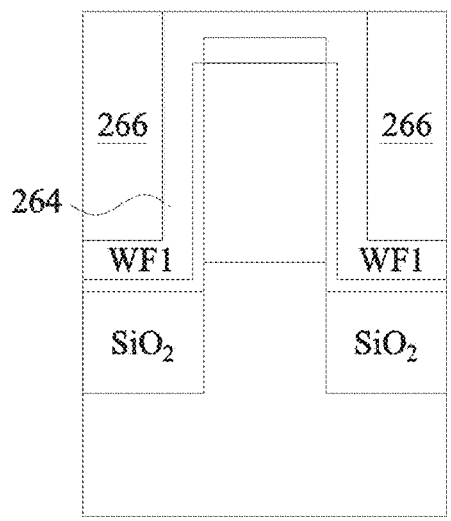
Figure 9D:
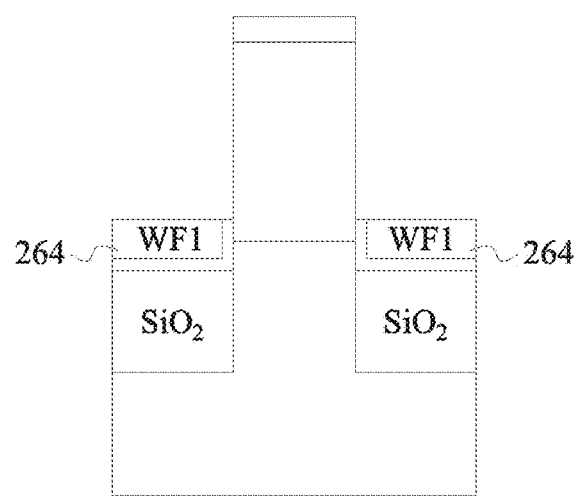

Referring back to FIG. 8, after depositing a gate insulator, a first metal layer is provided (operation 160). Providing a first metal layer may comprise depositing a first metal layer having a first workfunction level followed by depositing an oxide layer, and further followed by chemical mechanical polishing (CMP) operations (operation 162). The first metal layer and oxide layer may then be etched to leave a first metal gate layer having a first thickness level (operation 164). FIG. 9C provides a cross-sectional view of an example semiconductor structure after a first metal gate layer 264 and oxide 266 have been deposited. FIG. 9D provides a cross-sectional view of an example semiconductor structure after etching the first metal layer 264 and oxide to the first thickness level.

Referring back to FIG. 8, gate isolation can be provided between the first workfunction metal layer and the second workfunction metal layer. This may comprise depositing gate isolation over the first metal layer and forming a spacer above a portion of the gate isolation (operation 168), followed by removing the gate isolation not under the spacer and removing the spacer (operation 170). FIG. 9E provides a cross-sectional view of an example semiconductor structure after depositing gate isolation 266 over the first metal layer 264 and forming a spacer 268 above a portion of the gate isolation 266. FIG. 9F provides a cross-sectional view of an example semiconductor structure after removing the gate isolation 266 not adjacent to the spacer and removing the spacer.

Referring back to FIG. 8, after providing additional gate insulation, a second metal gate layer is provided (operation 172). Providing a second metal gate layer may comprise depositing a second metal layer having a second workfunction level followed by depositing an oxide layer, and further followed by chemical mechanical polishing (CMP) operations (operation 174). The second metal layer and oxide layer may then be etched to leave a second metal layer having a second thickness level (operation 176). The first thickness level and the second thickness level can be chosen to produce a metal gate having a desired gate length. FIG. 9G provides a cross-sectional view of an example semiconductor structure after a second metal layer 270 and oxide 272 have been deposited.

FIG. 9H provides a cross-sectional view of an example semiconductor structure after etching the second metal layer 270 and oxide 272 to the second thickness level. Shown is a semiconductor structure comprising a vertical channel structure 252 extending from a substrate 254 and formed as a channel between a source region and a drain region. The semiconductor structure further comprises a metal gate 271 that surrounds a portion of the vertical channel structure 252. The metal gate 271 has a gate length. The metal gate 271 has a first gate section 264 with a first workfunction and a first thickness. The metal gate 271 also has a second gate section 270 with a second workfunction and a second thickness. The first thickness level may be different from the second thickness level and the sum of the first thickness level and the second thickness level is equal to the gate length. The ratio of the first thickness level to the second thickness level for the gate length can be chosen to achieve a particular threshold voltage level for the semiconductor device. A portion of the first metal gate section 264 is separated from a portion of the second metal gate section 270 by intervening gate oxide 266.

Figure 10:
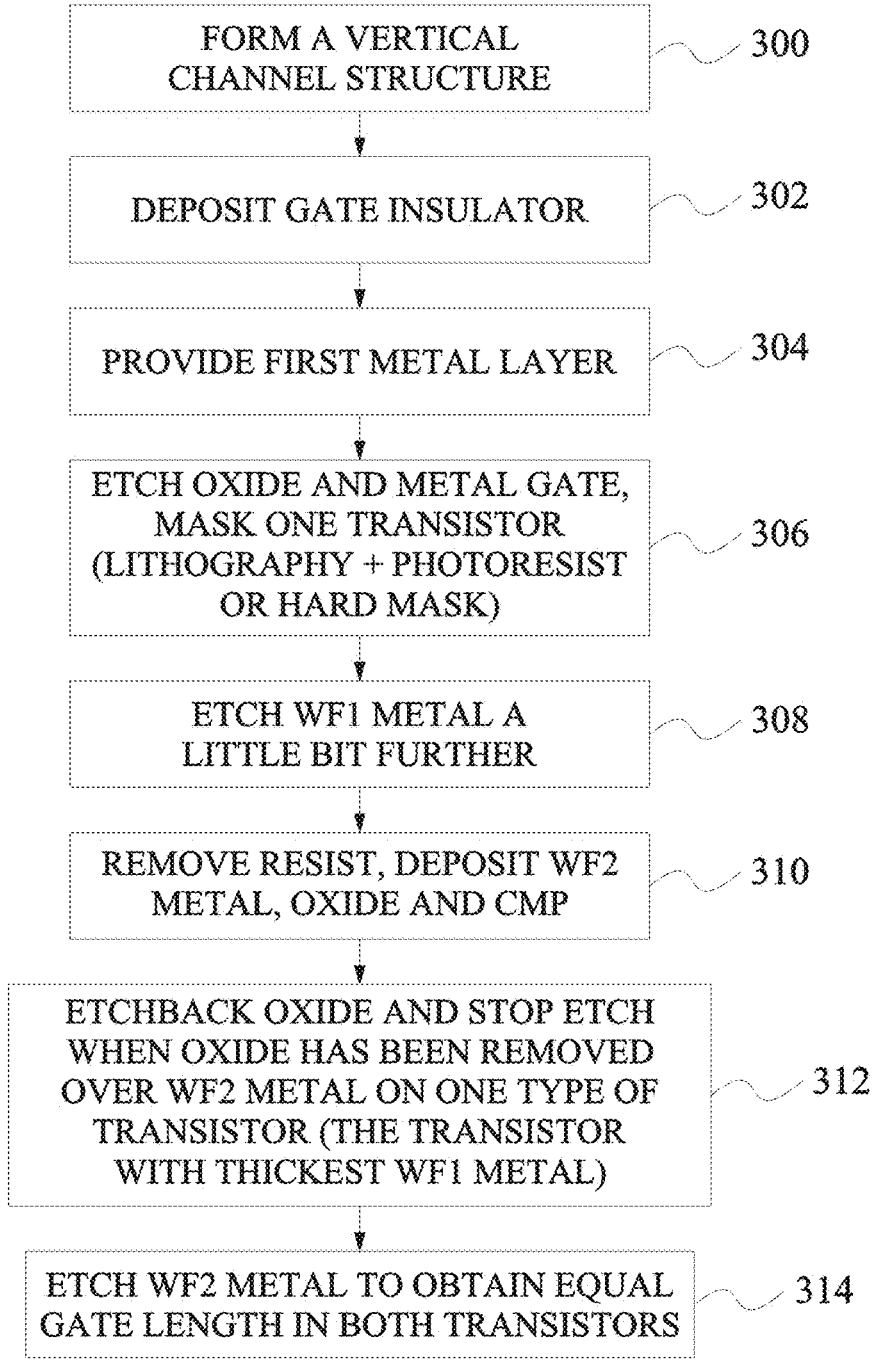
FIG. 10 is a process flow chart illustrating an example method of fabricating a semiconductor structure in accordance with some embodiments.

FIG. 10 is a process flow chart illustrating an example method of fabricating a semiconductor structure comprising two semiconductor devices having multiple gate sections with different workfunction levels. A vertical channel structure extending from a substrate and formed as a channel between a source region and a drain region is formed for each device (operation 300). Then, a gate insulator is deposited above the oxide region and around the vertical channel structure for each device (operation 302). After depositing a gate insulator, a first metal layer is provided for each device (operation 304). Providing a first metal layer may comprise depositing a first metal gate layer having a first workfunction level followed by depositing an oxide layer, and further followed by chemical mechanical polishing (CMP) operations.

Figure 11A:
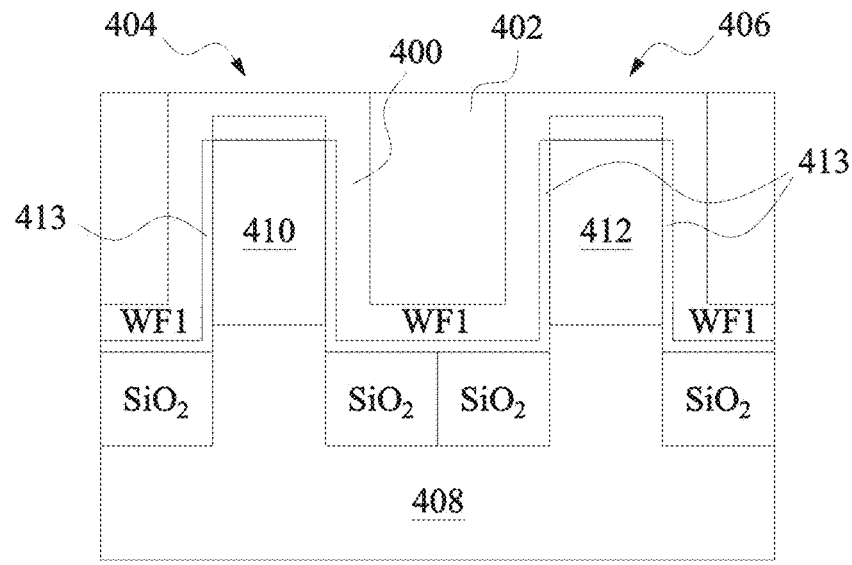
FIGS. 11A-11F are drawings depicting example states of a semiconductor structure during fabrication thereof in accordance with some embodiments.

FIG. 11A provides a cross-sectional view of an example semiconductor structure after a first metal layer 400 and oxide 402 have been deposited over a structure comprising a first device 404 and a second device 406. The first and second devices 404, 406 share a substrate 408, each have a vertical channel region 410, 412, and each have gate insulator 413 surrounding the vertical channel regions 410, 412.

Figure 11B:
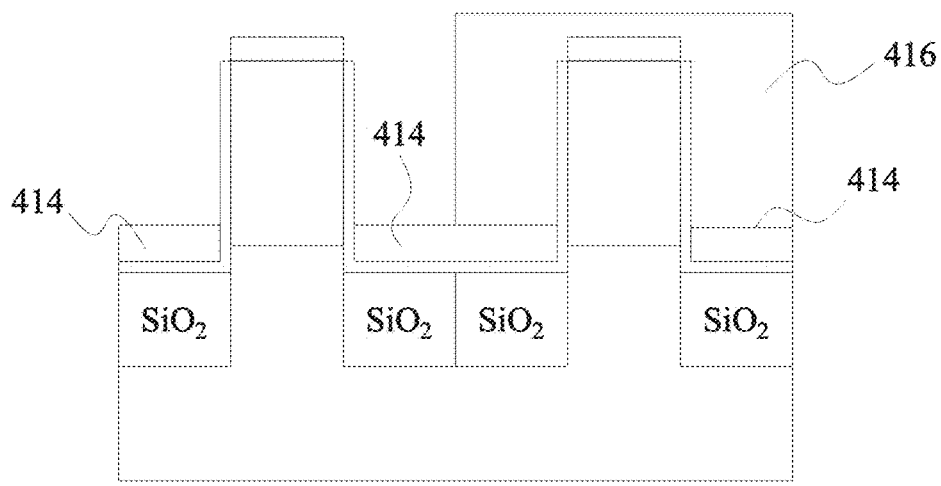

Referring back to FIG. 10, the first metal layer and oxide layer may then be etched (operation 306). Etching, in this example, involves etching the first metal layer and oxide layer to a first thickness level and providing a mask over one of the devices. FIG. 11B provides a cross-sectional view of an example semiconductor structure after etching the first metal layer 414 to a first thickness level and providing a mask 416 over one of the devices. Masking one device may involve lithography and photo resist operations. Masking may also involve applying a hard mask over one of the devices.

Figure 11C:
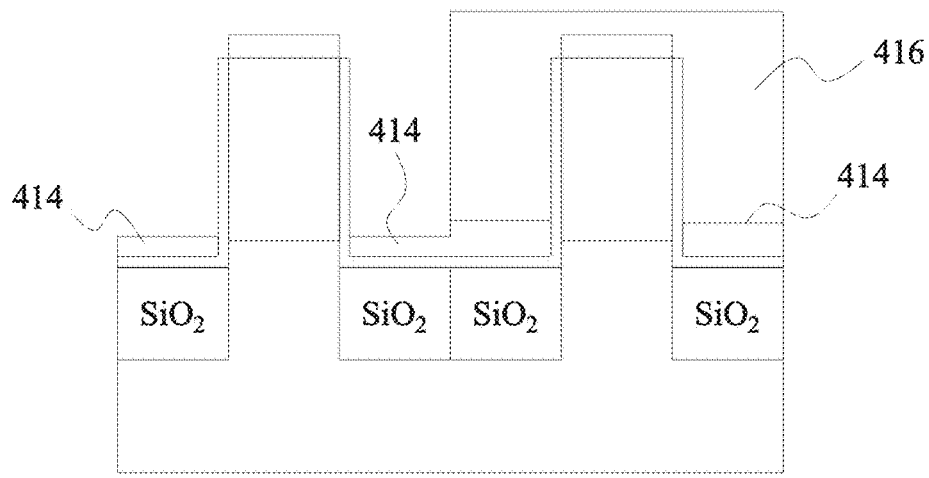

Referring back to FIG. 10, after masking one of the devices, the first metal gate layer in the other device may be etched further to a second thickness level (operation 308). FIG. 11C provides a cross-sectional view of an example semiconductor structure after etching the first metal layer 414 to the second thickness level wherein the second thickness level is lower than the first thickness level.

Figure 11D:
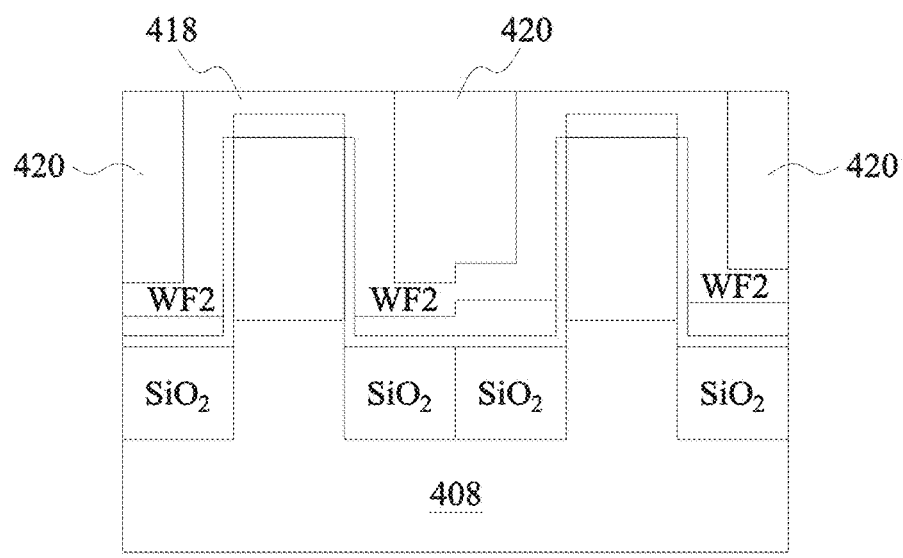

Referring back to FIG. 10, the mask may be removed from the device having the mask. After mask removal, the second metal layer and oxide may be deposited over the two devices and subjected to CMP (operation 310). FIG. 11D provides a cross-sectional view of an example semiconductor structure after depositing the second metal layer 418 and oxide 420.

Figure 11E:
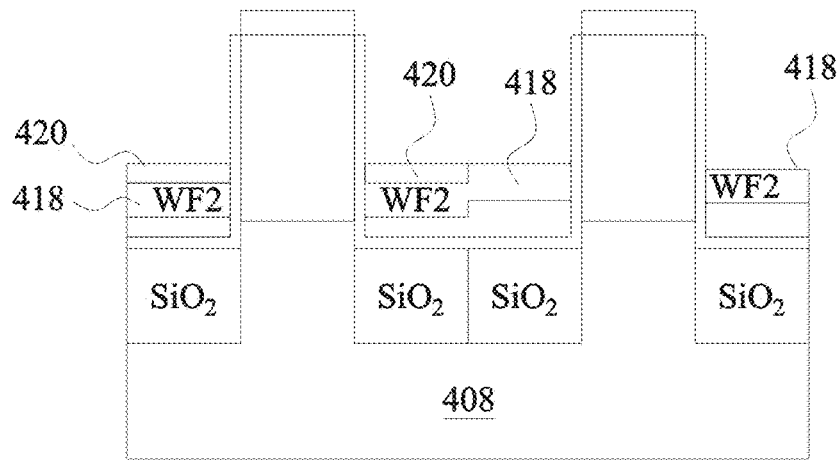

Referring back to FIG. 10, the oxide may be etched back and the etching stopped when the oxide has been removed over the second metal layer on the device with the thickest first metal layer (operation 312). FIG. 11E provides a cross-sectional view of an example semiconductor structure after etching the oxide 420 until oxide has been removed over the second metal layer 418 on the device 406 with the thickest first metal layer 414.

Figure 11F:
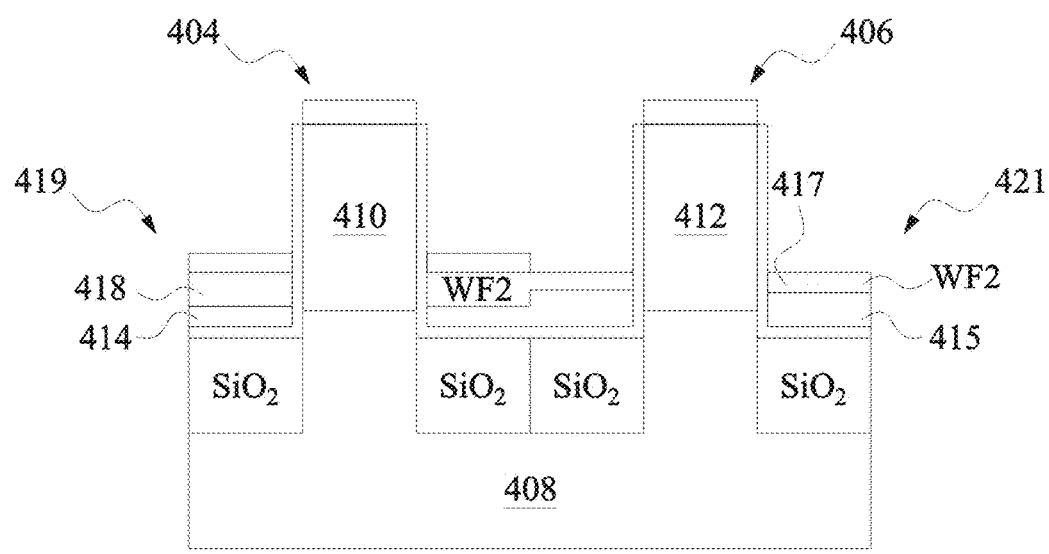

Referring back to FIG. 10, the second metal layer may be etched to obtain equal gate lengths in both devices (operation 314). FIG. 11F provides a cross-sectional view of an example semiconductor structure after etching the second metal layer 418 to obtain equal gate lengths in both devices 404, 406.

Shown is a semiconductor structure comprising a vertical channel structure 410 extending from a substrate 408 and formed as a channel between a source region and a drain region. The semiconductor structure further comprises a metal gate 419 that surrounds a portion of the vertical channel structure 410. The metal gate 419 has a gate length. The metal gate 419 has a first gate section 414 with a first workfunction and a first thickness. The metal gate 419 also has a second gate section 418 with a second workfunction and a second thickness. The first thickness level may be different from the second thickness level and the sum of the first thickness level and the second thickness level is equal to the gate length. The ratio of the first thickness level to the second thickness level for the gate length can be chosen to achieve a particular threshold voltage level for the semiconductor device. The semiconductor structure further comprises a second vertical channel structure 412 extending from the substrate 408 and formed as a channel between a second source region and a second drain region and a second metal gate 421 that surrounds a portion of the second vertical channel structure 412. The second metal gate 421 has a gate length. The second metal gate 421 has a third gate section 415 with the first workfunction and a third thickness. The second metal gate 421 has a fourth gate section 417 with the second workfunction and a fourth thickness. The third thickness may be different from the fourth thickness and the sum of the third thickness and the fourth thickness is equal to the gate length. The ratio of the third thickness to the fourth thickness for the gate length can be chosen to achieve a different threshold voltage level for the portion of the semiconductor structure comprising the second vertical channel 412 and the second metal gate 421.

A resulting semiconductor structure may have multiple devices, such as transistors, with different threshold voltage levels. Both devices may have the same gate length, but one device has a first metal gate layer with a thickness that is different from the thickness of the first metal gate layer in the other device. Similarly, one device may have a second metal gate layer with a thickness that is different from the thickness of the second metal gate layer in the other device. By carefully choosing the relative thickness of the various gate levels in the devices, devices with different threshold voltages may be fabricated on the same substrate.

Figure 22B:
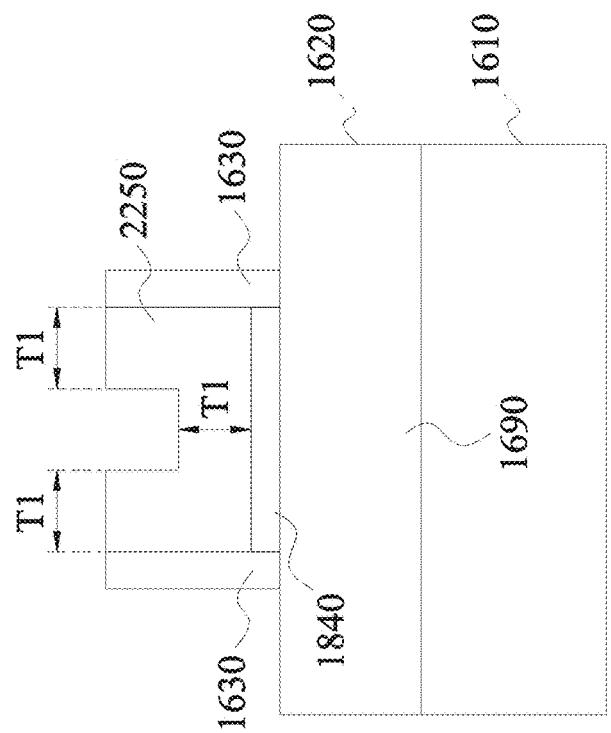
FIGS. 22A and 22B are drawings depicting example states of a semiconductor device during fabrication of a gate stack thereof in accordance with some embodiments.
Figure 22A:
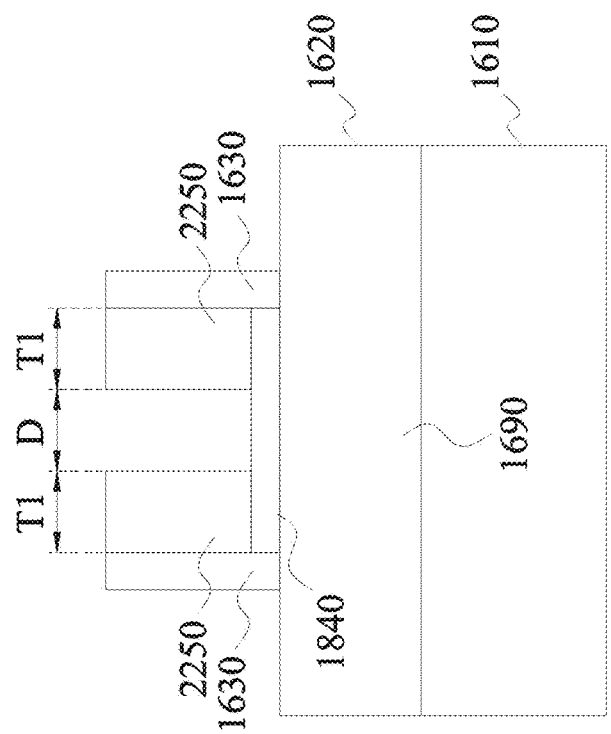

FIG. 12 is a process flow chart illustrating an example method 1200 of fabricating a gate stack of a semiconductor device in accordance with some embodiments. The method 1200 begins with operation 1210, at which a semiconductor device, e.g., the semiconductor device of FIG. 16, is provided. The semiconductor device includes a pair of spacers, e.g., the spacers 1630 of FIG. 16, that define an accommodating space therebetween. Then, at operation 1220, the accommodating space is partially filled with a gate insulator, e.g., the gate insulator 1840 of FIG. 18 or the gate insulator 2440 of FIG. 24. Subsequently, at operation 1230, a metal gate layer, e.g., the metal gate layer 2050 of FIG. 20A or the metal gate layer 2250 of FIG. 22A, is deposited in the accommodating space. Thereafter, at operation 1240, the metal gate layer that is between the metal gate layers that are on the spacers is removed, thereby exposing the gate insulator that is between the metal gate layers that are on the spacers.

Figure 28B:
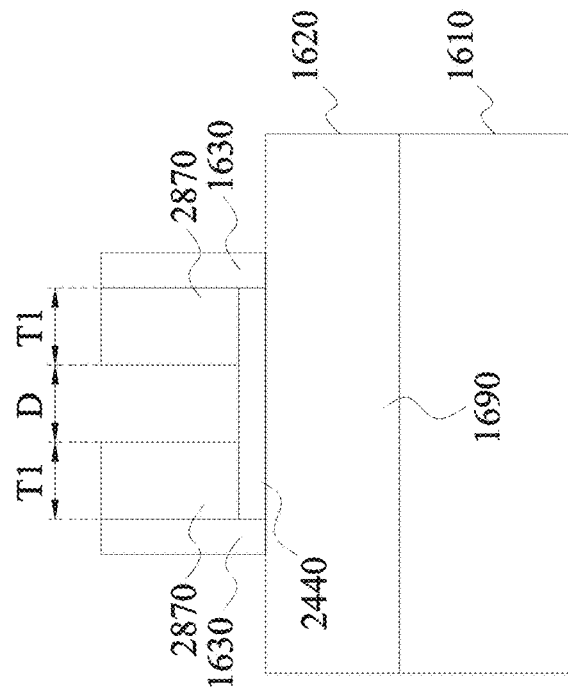
FIGS. 28A and 28B are drawings depicting example states of a semiconductor device during fabrication of a gate stack thereof in accordance with some embodiments.
Figure 28A:
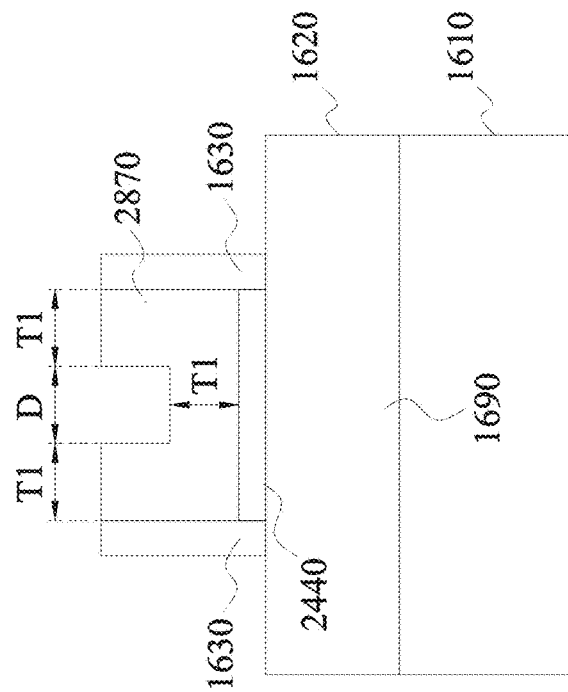

FIG. 13 is a process flow chart illustrating an example method 1300 of fabricating a gate stack of a semiconductor device in accordance with some embodiments. The method 1300 begins with operation 1310, at which a semiconductor device, e.g., the semiconductor device of FIG. 16, is provided. The semiconductor device includes a pair of spacers, e.g., the spacers 1630 of FIG. 16, that define an accommodating space therebetween. Then, at operation 1320, the accommodating space is partially filled with a gate insulator, e.g., the gate insulator 1840 of FIG. 18 or the gate insulator 2440 of FIG. 24. Subsequently, at operation 1330, a dummy gate layer, e.g., the dummy gate layer 2670 of FIG. 26A or the dummy gate layer 2870 of FIG. 28A, is deposited in the accommodating space. Thereafter, at operation 1340, the dummy gate layer that is between the dummy gate layers that are on the spacers is removed, such as by dry or wet etch, thereby exposing the gate insulator that is between the dummy gate layers that are on the spacers.

Figure 14:
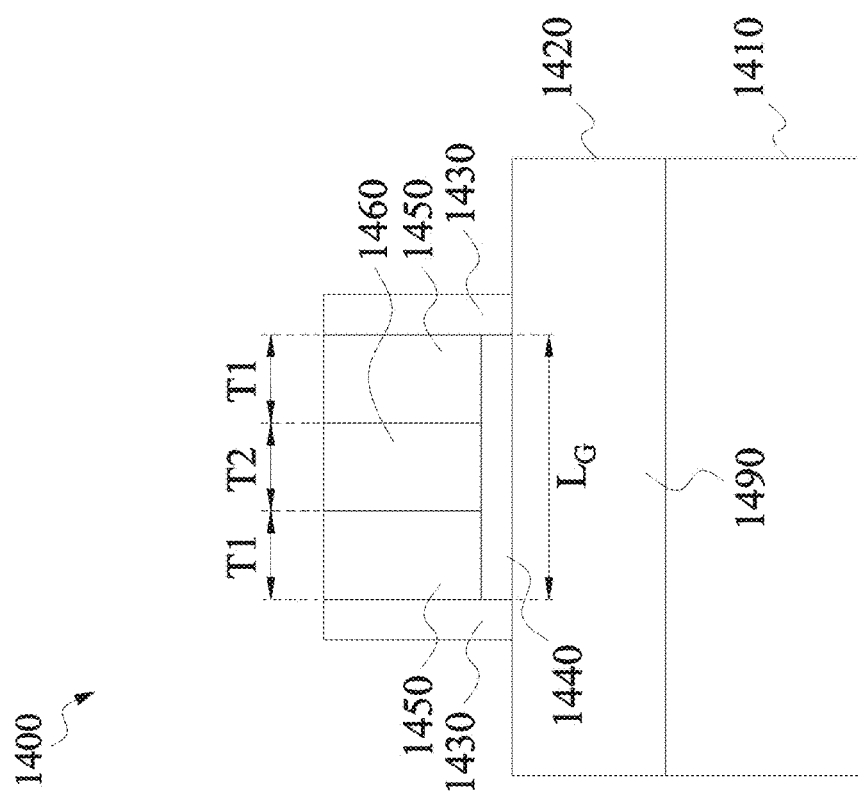
FIG. 14 is a diagram illustrating a cross-sectional view of an example semiconductor device in accordance with some embodiments.

FIG. 14 is a diagram illustrating a cross-sectional view of an example semiconductor device 1400 in accordance with some embodiments. The semiconductor device 1400 includes a substrate 1410, a fin 1420, a pair of spacers 1430, and a gate stack. The fin 1420 extends from and along the length of the substrate 1410 and includes a pair of source and drain regions (not shown) and a channel region 1490 that interconnects the source and drain regions. In some embodiments, the source and drain regions are disposed in the fin 1420. In other embodiments, the source and drain regions extend from above and into the fin 1420. The spacers 1430 are generally parallel, extend across the fin 1420, intersect the channel region 1490, and define an accommodating space therebetween.

The gate stack includes a gate insulator 1440, a pair of metal gate layers 1450, and a metal gate layer 1460. The gate insulator 1440 partially fills the accommodating space and surrounds and extends along the length of the channel region 1490. In this embodiment, the metal gate layers 1450 and the metal gate layer 1460 are stacked in a direction generally parallel to a direction of a current flowing through the channel region 1490. The construction as such permits a wider range of threshold voltage for the semiconductor device 1400. In particular, the metal gate layers 1450 further partially fill the accommodating space, have a first workfunction, are respectively on the spacers 1430, and surround and extend from, and are therefore in contact with, the gate insulator 1440. The metal gate layer 1460 substantially fills the accommodating space, has a second workfunction different from the first workfunction, is between the metal gate layers 1450, and surrounds and extends from, and is therefore in contact with, the gate insulator 1440. In this embodiment, the metal gate layers 1450 have substantially the same thickness (T1). In some embodiments, the metal gate layer 1460 has a thickness (T2) substantially the same as the thickness (T1) such that the metal gate layer 1460 covers for example about 33.3% of the gate length ($L_G$). In other embodiments, the thickness (T2) is greater than the thickness (T1) such that the metal gate layer 1460 covers for example about 50% of the gate length ($L_G$) or less than the thickness (T1) such that the metal gate layer 1460 covers for example about 25% the gate length ($L_G$). Further, in this embodiment, the sum of the thickness (T2) and two times the thickness (T1) is substantially equal to a gate length ($L_G$), e.g., less than about 20 nm.

By way of example, as illustrated in FIG. 2A, if a threshold voltage of the semiconductor device 1400 increases with a workfunction of a metal gate layer and if the second workfunction (WF2) is greater than the first workfunction (WF1), then a threshold voltage (VTH2) of a device that includes only the metal gate layer 1460 is higher than a threshold voltage (VTH1) of a device that includes only the metal gate layer 1450. As also illustrated in FIG. 2A, the semiconductor device 1400 that includes the stack of metal gate layers 1450, 1460 will have a threshold voltage (VTH12) between the threshold voltage (VTH1) and the threshold voltage (VTH2).

As illustrated in FIG. 2B, by increasing the thickness (T2) and thus reducing accordingly the thickness (T1) to keep the gate length ($L_G$) constant, i.e., $L_G=2(T1)+T2$, the threshold voltage (VTH12) of the semiconductor device 1400 may increase monotonically from the threshold voltage (VTH1) to the threshold voltage (VTH2).

As illustrated in FIG. 2C, if x is defined as the percentage of the gate length ($L_G$) covered by the metal gate layer 1460, then $T2=x L_G$ and $T1=(1-x)L_G/2$. If x=0, the gate stack is 100% made of the metal gate layer 1450 and the threshold voltage is VTH1. If x=1, the gate stack is 100% made of the metal gate layer 1460 and the threshold voltage is VTH2. Finally, if 0<x<1, the threshold voltage (VTH12) is between the threshold voltage (VTH1) and the threshold voltage (VTH2).

FIG. 15 is a process flow chart illustrating an example method 1500 of fabricating the gate stack of the semiconductor device 1400 of FIG. 14 in accordance with some embodiments. FIG. 16 is a drawing depicting an example state of the semiconductor device 1400 during fabrication of the gate stack thereof in accordance with some embodiments. First, at operation 1510, a semiconductor device is provided. As illustrated in FIG. 16, the semiconductor device includes a substrate 1610, a fin 1620, and a pair of spacers 1630. The fin 1620 extends from and along the length of the substrate 1610 and includes a pair of source and drain regions (not shown) and a channel region 1690 that interconnects the source and drain regions. In some embodiments, the source and drain regions are disposed in the fin 1620. In other embodiments, the source and drain regions extend from above and into the fin 1620. The spacers 1630 are generally parallel, extend across the fin 1620, intersect the channel region 1690, and define an accommodating space therebetween. Materials for the spacers 1630 include, but are not limited to, silicon nitride and some other materials such as plasma-enhanced oxide (PEOX) and tetraethoxysilane (TEOS) oxide.

In some embodiments, operation 1510 includes: providing the substrate 1610; forming a pair of trenches into the substrate 1610 to thereby form the fin 1620; doping the source and drain regions; depositing a poly gate layer that extends across the fin 1620 and that surrounds the channel region 1690; providing the spacers 1630 on sidewalls of the poly gate layer, respectively; and removing the poly gate layer.

Referring back to FIG. 15, subsequent to operation 1510, at which the semiconductor device is provided, a gate stack is formed in the accommodating space at operation 1520, in a manner that will be described hereinafter.

FIG. 17 is a process flow chart illustrating operation 1520 of FIG. 15 in accordance with some embodiments. FIG. 18 is a drawing depicting an example state of the semiconductor device 1400 during fabrication of the gate stack thereof in accordance with some embodiments. At operation 1710, the accommodating space is partially filled with, such as by depositing therein, a gate insulator 1840. Materials for the gate insulator 1840 include, but are not limited to, silicon dioxide, silicon oxynitride, aluminum oxide, tantalum pentoxide, hafnium oxide, zirconium oxide, barium strontium tintanate, and some other high-k dielectric materials. The gate insulator 1840 surrounds and extends along the length of the channel region 1690, as illustrated in FIG. 18. In some embodiments, the gate insulator 1840 is deposited in the accommodating space to a thickness of about 4 nm or less.

Referring back to FIG. 17, subsequent to operation 1710, at which the accommodating space is partially filled with the gate insulator 1840, the accommodating space is further partially filled with a pair of spaced apart metal gate layers that have a first workfunction at operation 1720.

Figure 19:
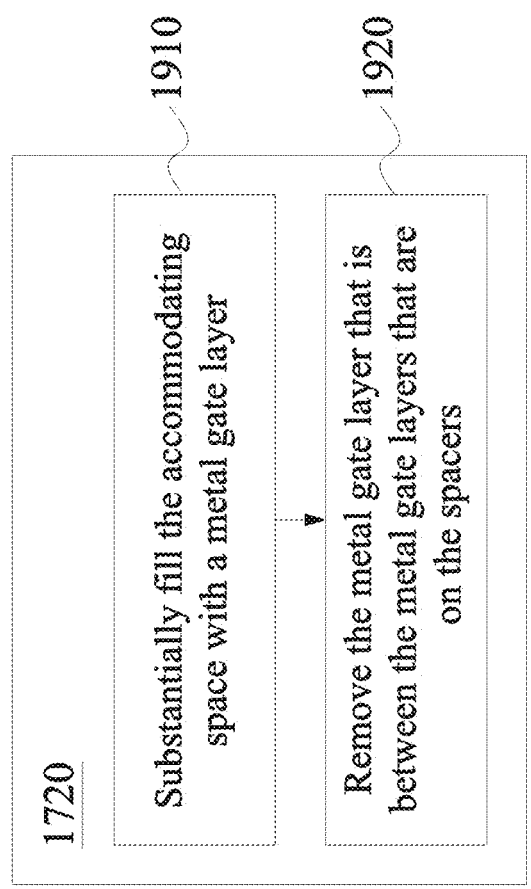
FIG. 19 is a process flow chart illustrating operation 1720 of FIG. 17 in accordance with some embodiments.
Figure 20B:
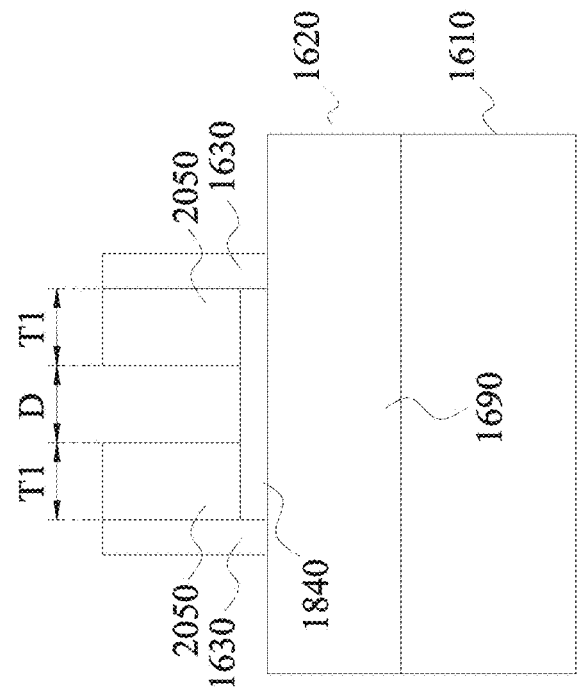
FIGS. 20A and 20B are drawings depicting example states of a semiconductor device during fabrication of a gate stack thereof in accordance with some embodiments.
Figure 20A:
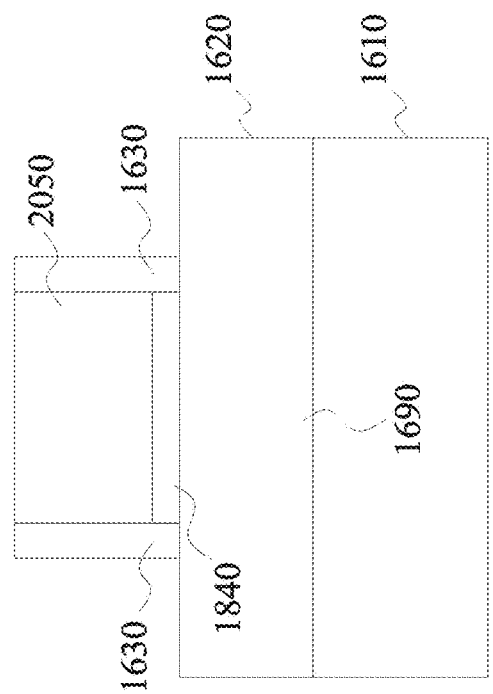

FIG. 19 is a process flow chart illustrating operation 1720 of FIG. 17 in accordance with some embodiments. FIGS. 20A and 20B are drawings depicting example states of the semiconductor device 1400 during fabrication of the gate stack thereof in accordance with some embodiments. At operation 1910, the accommodating space is substantially filled with, by blanket depositing therein, a metal gate layer 2050 that has the first workfunction. Operation 1910 is followed by a CMP operation, in some embodiments. As illustrated in FIG. 20A, the metal gate layer 2050 surrounds and extends from, and is therefore in contact with, the gate insulator 1840. Thereafter, referring back to FIG. 19, at operation 1920, the metal gate layer 2050 that is between the metal gate layers 2050 that are on the spacers 1630 is removed, thereby exposing the gate insulator 1840 that is between the metal gate layers 2050 that are on the spacers 1630. As illustrated in FIG. 20B, the metal gate layers 2050 that are on the spacers 1630 have substantially the same first thickness (T1) and define a distance (D) therebetween. In some embodiments, the distance (D) is substantially the same as the first thickness (T1). In other embodiments, the distance (D) is different from, i.e., less or greater than, the first thickness (T1).

Figure 21:
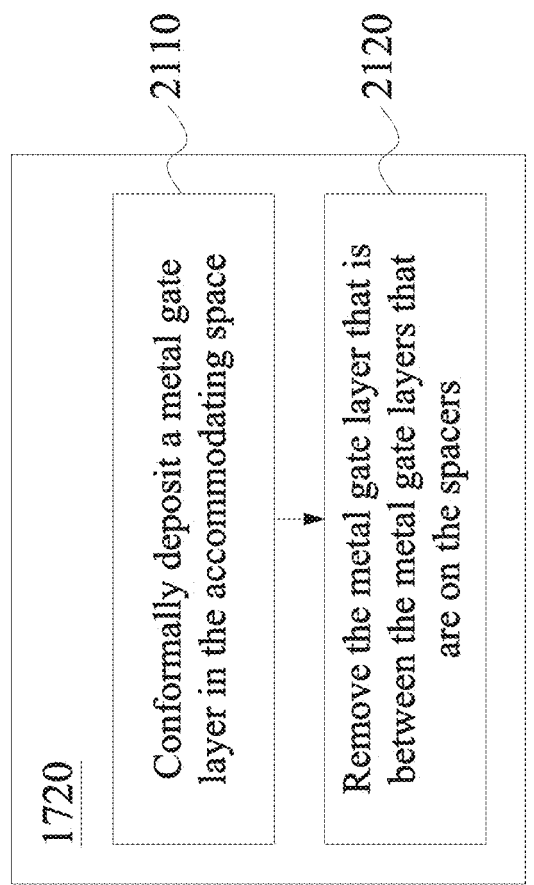
FIG. 21 is a process flow chart illustrating operation 1720 of FIG. 17 in accordance with some embodiments.

FIG. 21 is a process flow chart illustrating operation 1720 of FIG. 17 in accordance with some embodiments. FIGS. 22A and 22B are drawings depicting example states of the semiconductor device 1400 during fabrication of the gate stack thereof in accordance with some embodiments. At operation 2110, the accommodating space is further partially filled with, such as by depositing therein in a conformal manner using, e.g., an atomic layer deposition (ALD) technique, a metal gate layer 2250 that has the first workfunction. As illustrated in FIG. 22A, the metal gate layer 2250 surrounds and extends from, and is therefore in contact with, the gate insulator 1840. As also illustrated in FIG. 22A, the metal gate layers 2250 that are on the spacers 1630 and the metal gate layer 2250 that is between the metal gate layers 2050 that are on spacers 1630 all have substantially the same first thickness (T1). Thereafter, referring back to FIG. 21, at operation 2120, the metal gate layer 2250 that is between the metal gate layers 2250 that are on the spacers 1630 is removed, thereby exposing the gate insulator 1840 that is between the metal gate layers 2250 that are on the spacers 1630. As illustrated in FIG. 22B, the metal gate layers 2250 that are on the spacers 1630 define a distance (D) therebetween. In some embodiments, the distance (D) is substantially the same as the first thickness (T1). In other embodiments, the distance (D) is different from, i.e., less or greater than, the first thickness (T1).

Referring back to FIG. 17, after operation 1720, at which the accommodating space is further partially filled with the metal gate layers that have the first workfunction, the accommodating space is substantially filled with a metal gate layer that has a second workfunction different from the first workfunction and that surrounds and extends from, and that is therefore in contact with, the gate insulator 1840 at operation 1730, which in some embodiments is followed by a CMP operation, thereby resulting in the semiconductor device 1400 of FIG. 14.

Figure 24:
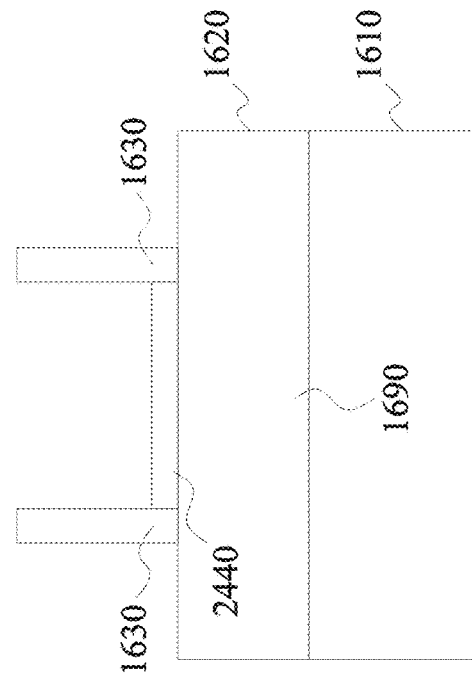
FIG. 24 is a drawing depicting an example state of a semiconductor device during fabrication of a gate stack thereof in accordance with some embodiments.
Figure 23:
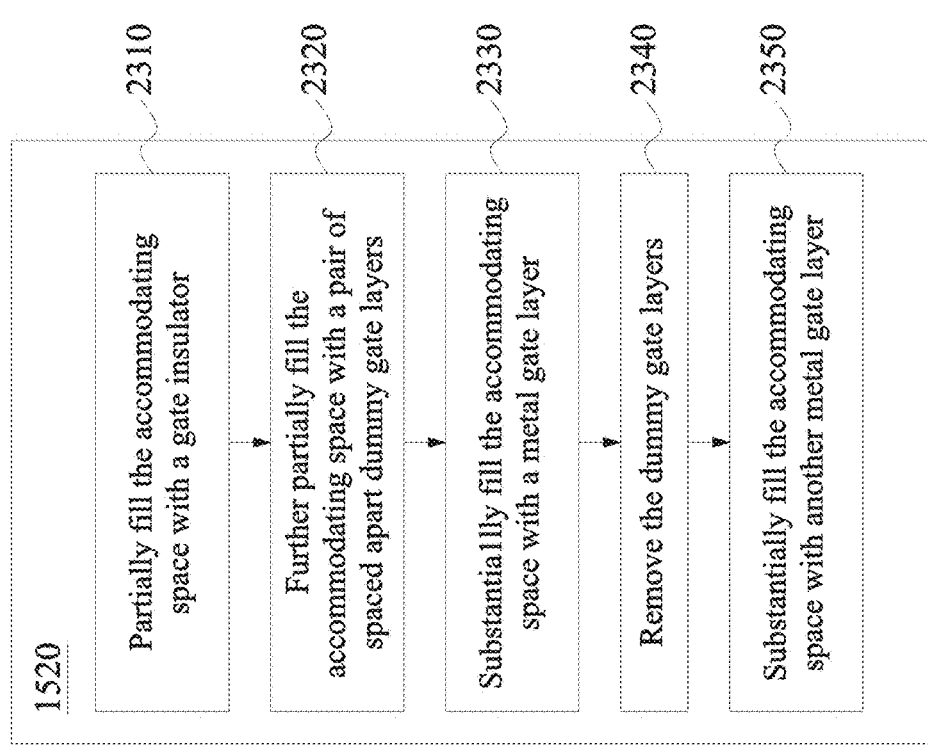
FIG. 23 is a process flow chart illustrating operation 1520 of FIG. 15 in accordance with some embodiments.

FIG. 23 is a process flow chart illustrating operation 1520 of FIG. 15 in accordance with some embodiments. FIG. 24 is a drawing depicting an example state of the semiconductor device 1400 during fabrication of the gate stack thereof in accordance with some embodiments. At operation 2310, the accommodating space is partially filled with, such as by depositing therein, a gate insulator 2440. Materials for the gate insulator 2440 include, but are not limited to, silicon dioxide, silicon oxynitride, aluminum oxide, tantalum pentoxide, hafnium oxide, zirconium oxide, barium strontium tintanate, and some other high-k dielectric materials. The gate insulator 2440 surrounds and extends along the length of the channel region 1690, as illustrated in FIG. 24. In some embodiments, the gate insulator 2440 is deposited in the accommodating space to a thickness of about 4 nm or less.

Referring back to FIG. 23, subsequent to operation 2310, at which the accommodating space is partially filled with the gate insulator 2440, the accommodating space is further partially filled with a pair of spaced apart dummy gate layers at operation 2320.

Figure 25:
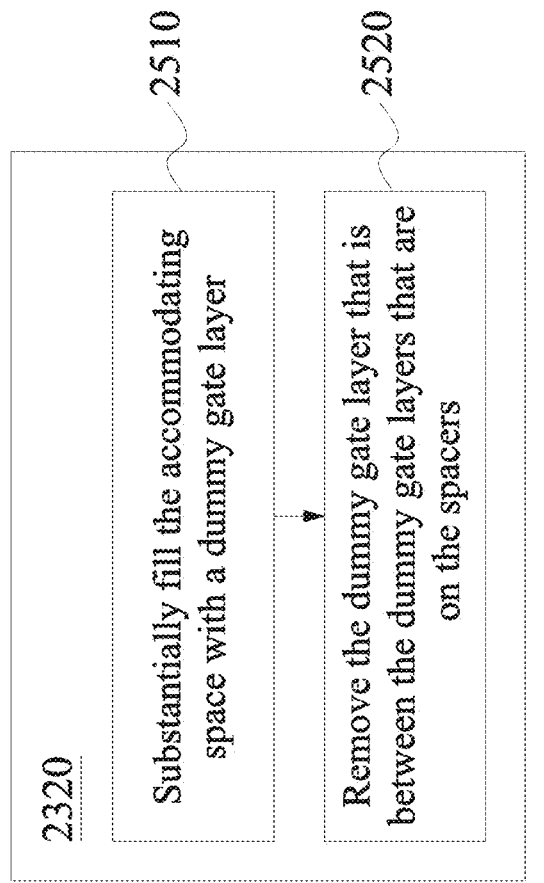
FIG. 25 is a process flow chart illustrating operation 2320 of FIG. 23 in accordance with some embodiments.
Figure 26B:
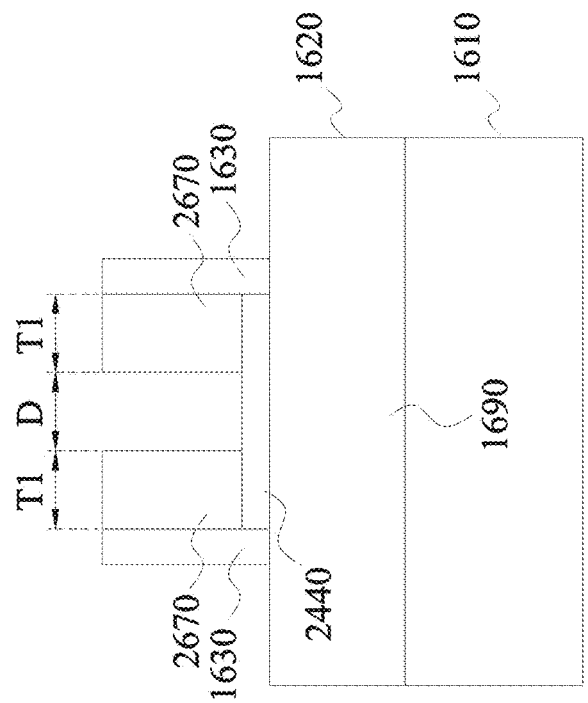
FIGS. 26A and 26B are drawings depicting example states of a semiconductor device during fabrication of a gate stack thereof in accordance with some embodiments.
Figure 26A:
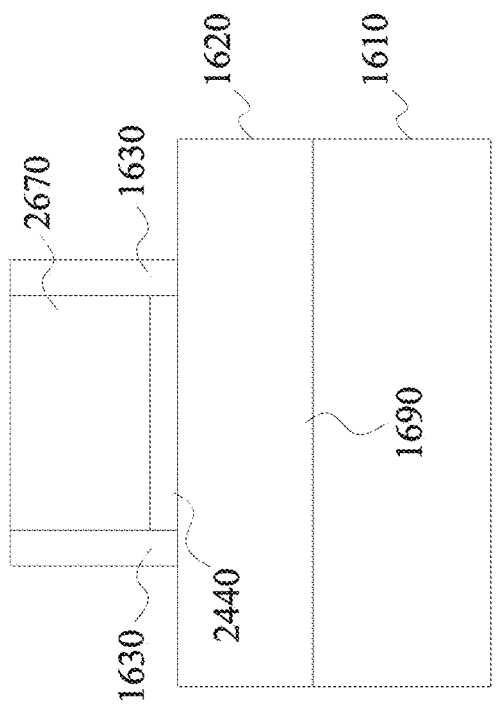

FIG. 25 is a process flow chart illustrating operation 2320 of FIG. 23 in accordance with some embodiments. FIGS. 26A and 26B are drawings depicting example states of the semiconductor device 1400 during fabrication of the gate stack thereof in accordance with some embodiments. At operation 2510, the accommodating space is substantially filled with, by blanket depositing therein, a dummy gate layer 2670. Examples of materials for the dummy gate layer 2670 include, but are not limited to, silicon oxide, PEOX, germanium oxide, polymer, resist, and some other materials that have an etching rate higher than an etching rate of the gate insulator 2440. Operation 2510 is followed by a CMP operation, in some embodiments. As illustrated in FIG. 26A, the dummy gate layer 2670 surrounds and extends from, and is therefore in contact with, the gate insulator 2440. Thereafter, referring back to FIG. 25, at operation 2520, the dummy gate layer 2670 that is between the dummy gate layers 2670 that are on the spacers 1630 is dry- or wet-etched, thereby exposing the gate insulator 2440 that is between the dummy gate layers 2670 that are on the spacers 1630. As illustrated in FIG. 26B, the dummy gate layers 2670 that are on the spacers 1630 have substantially the same first thickness (T1) and define a distance (D) therebetween. In some embodiments, the distance (D) is substantially the same as the first thickness (T1). In other embodiments, the distance (D) is different from, i.e., less or greater than, the first thickness (T1).

Figure 27:
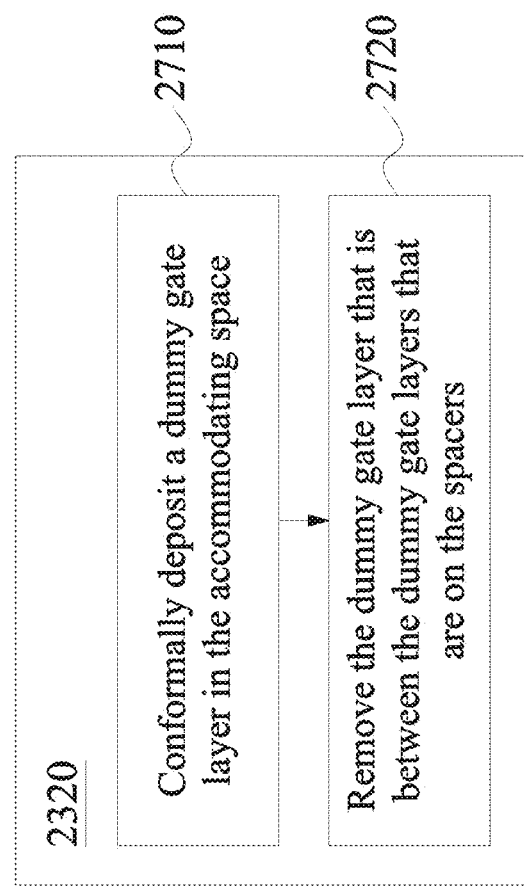
FIG. 27 is a process flow chart illustrating operation 2320 of FIG. 23 in accordance with some embodiments.

FIG. 27 is a process flow chart illustrating operation 2320 of FIG. 23 in accordance with some embodiments. FIGS. 28A and 28B are drawings depicting example states of the semiconductor device 1400 during fabrication of the gate stack thereof in accordance with some embodiments. At operation 2710, the accommodating space is further partially filled with, such as by depositing therein in a conformal manner, e.g., through an ALD process, a dummy gate layer 2870. Examples of materials for the dummy gate layer 2870 include, but are not limited to, silicon oxide, PEOX, germanium oxide, polymer, resist, and some other materials that have an etching rate higher than an etching rate of the gate insulator 2440. As illustrated in FIG. 28A, the dummy gate layer 2870 surrounds and extends from, and is therefore in contact with, the gate insulator 2440. As also illustrated in FIG. 28A, the dummy gate layers 2870 that are on the spacers 1630 and the dummy gate layer 2870 that is between the dummy gate layers 2870 that are on the spacers 1630 all have substantially the same first thickness (T1). Thereafter, referring back to FIG. 27, at operation 2720, the dummy gate layer 2870 that is between the dummy gate layers 2870 that are on the spacers 1630 is dry- or wet-etched, thereby exposing the gate insulator 2440 that is between the dummy gate layers 2870 that are on the spacers 1630. As illustrated in FIG. 28B, the dummy gate layers 2870 that are on the spacers 1630 define a distance (D) therebetween. In some embodiments, the distance (D) is substantially the same as the first thickness (T1). In other embodiments, the distance (D) is different from, i.e., less or greater than, the first thickness (T1).

Figure 29A:
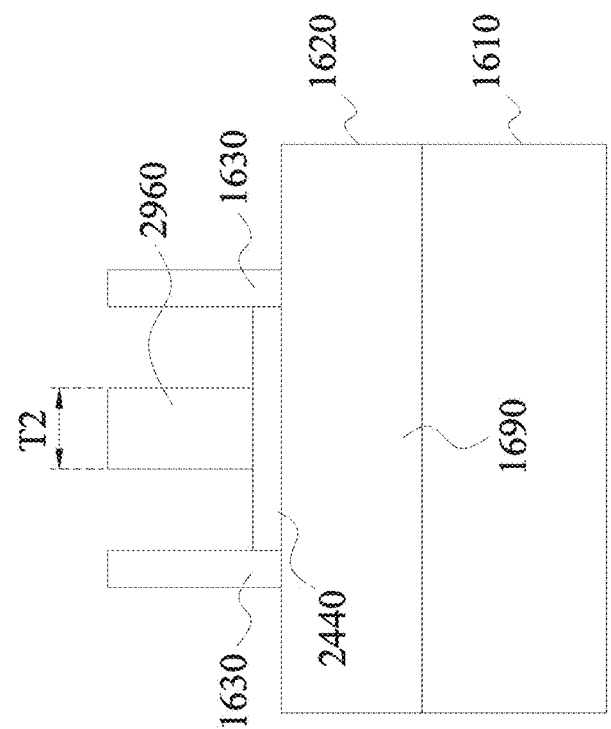
FIGS. 29A and 29B are drawings depicting example states of a semiconductor device during fabrication of a gate stack thereof in accordance with some embodiments.
Figure 29B:
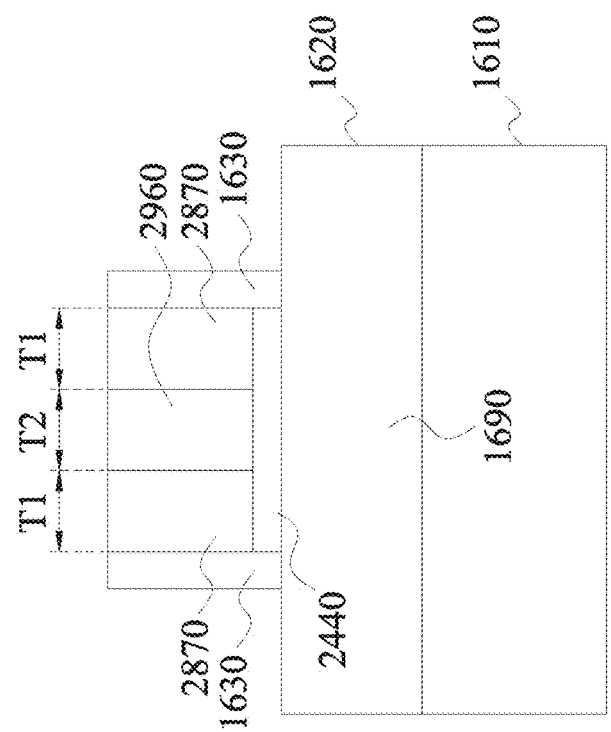

FIGS. 29A and 29B are drawings depicting example states of the semiconductor device 1400 during fabrication of the gate stack thereof in accordance with some embodiments. Referring back to FIG. 23, after operation 2320, at which the accommodating space is further partially filled with the dummy gate layers, as illustrated in FIG. 29A, the accommodating space is substantially filled with a metal gate layer 2960 that has a second workfunction and that surrounds and extends from, and is therefore in contact with, the gate insulator 2440 at operation 2330, which in some embodiments is followed by a CMP operation. As also illustrated in FIG. 29A, the metal gate layer 2960 has a thickness (T2).

Referring back to FIG. 23, subsequent to operation 2330, at which the accommodating space is substantially filled with the metal gate layer 2960 that has the second workfunction, the dummy gate layers 2870 that are on the spacers 1630 are wet- or dry-etched at operation 2340, thereby exposing the gate insulator 2440 between the metal gate layer 2960 and the spacers 1630, as illustrated in FIG. 29B. Thereafter, referring back to FIG. 23, at operation 2350, which in some embodiments is followed by a CMP operation, the accommodating space is substantially filled with a metal gate layer that has a first workfunction different from the second workfunction and that surrounds and extends from, and is therefore in contact with, the gate insulator 2440, thereby resulting in the semiconductor device 1400 of FIG. 14.

FIG. 30 is a diagram illustrating a cross-sectional view of an example semiconductor device 3000 in accordance with some embodiments. The semiconductor device 3000 includes a substrate 3010, a pair of source and drain regions (not shown), a channel region (not shown), a pair of spacers 3030, and a gate stack. The channel region is disposed in the substrate 3010 and interconnects the source and drain regions. In some embodiments, the source and drain regions are disposed in the substrate 3010. In other embodiments, the source and drain regions extend from above and into the substrate 3010. The spacers 3030 are generally parallel, extend from the substrate 3010 and across the length of the channel region, and define an accommodating space therebetween.

The gate stack includes a gate insulator 3040, a pair of metal gate layers 3050, and a metal gate layer 3060. The gate insulator 3040 partially fills the accommodating space and extends from the substrate 3010 and along the length of the channel region. In this embodiment, the metal gate layers 3050 and the metal gate layer 3060 are stacked in a direction generally parallel to a direction of a flow of a current through the channel region. The construction as such permits a wider range of threshold voltage for the semiconductor device 3000. In particular, the metal gate layers 3050 further partially fill the accommodating space, have a first workfunction, are respectively on the spacers 3030, and extend from, and are therefore in contact with, the gate insulator 3040. The metal gate layer 3060 substantially fills the accommodating space, has a second workfunction different from the first workfunction, is between the metal gate layers 3050, and extends from, and is therefore in contact with, the gate insulator 3040. In this embodiment, the metal gate layers 3050 have substantially the same thickness (T1). In some embodiments, the metal gate layer 3060 has a thickness (T2) substantially the same as the thickness (T1) such that the metal gate layer 3060 covers for example about 33.3% of the gate length ($L_G$). In other embodiments, the thickness (T2) is greater than the thickness (T1) such that the metal gate layer 3060 covers for example about 50% of the gate length ($L_G$) or less than the thickness (T1) such that the metal gate layer 3060 covers for example about 25% the gate length ($L_G$). Further, in this embodiment, the sum of the thickness (T2) and two times the thickness (T1) is substantially equal to a gate length ($L_G$), e.g., less than about 20 nm. Since the fabrication of the gate stack of the semiconductor device 3000 is similar to those described heretofore, a detailed description of the same is omitted herein for the sake of brevity.

FIG. 31 is a diagram illustrating a cross-sectional view of an example semiconductor device 3100 in accordance with some embodiments. The semiconductor device 3100 includes a substrate 3110, a pair of source and drain regions 3180, a channel region 3190, a pair of spacers 3130, and a gate stack. The source and drain regions 3180 extend from the substrate 3110. The channel region 3190 suspends above the substrate 3110 and interconnects the source and drain regions 3180. The spacers 3130 are generally parallel, surround the channel region 3190, and define an accommodating space therebetween.

The gate stack includes a gate insulator 3140, a pair of metal gate layers 3150, and a metal gate layer 3160. The gate insulator 3140 partially fills the accommodating space and surrounds and extends along the length of the channel region 3190. In this embodiment, the metal gate layers 3150 and the metal gate layer 3160 are stacked in a direction generally parallel to a direction of a flow of a current through the channel region 3190. The construction as such permits a wider range of threshold voltage for the semiconductor device 3100. In particular, the metal gate layers 3150 further partially fill the accommodating space, have a first workfunction, are respectively on the spacers 3130, and surround and extend from, and are therefore in contact with, the gate insulator 3140. The metal gate layer 3160 substantially fills the accommodating space, has a second workfunction different from the first workfunction, is between the metal gate layers 3150, and surrounds and extends from, and is therefore in contact with, the gate insulator 3140. In this embodiment, the metal gate layers 3150 have substantially the same thickness (T1). In some embodiments, the metal gate layer 3160 has a thickness (T2) substantially the same as the thickness (T1) such that the metal gate layer 3160 covers for example about 33.3% of the gate length ($L_G$). In other embodiments, the thickness (T2) is greater than the thickness (T1) such that the metal gate layer 3160 covers for example about 50% of the gate length ($L_G$) or less than the thickness (T1) such that the metal gate layer 3160 covers for example about 25% the gate length ($L_G$). Further, in this embodiment, the sum of the thickness (T2) and two times the thickness (T1) is substantially equal to a gate length ($L_G$), e.g., less than about 20 nm. Since the fabrication of the gate stack of the semiconductor device 3100 is similar to those described heretofore, a detailed description of the same is omitted herein for the sake of brevity.

Using techniques described herein the threshold voltage of a transistor may be tuned using various thicknesses of metal deposition. Using two metals with different threshold voltages (VTH1 and VTH2), the threshold voltage of a device may be tuned between VTH1 and VTH2.

In one embodiment, a semiconductor device is provided. The semiconductor device comprises a channel region and a gate stack. The gate stack includes a gate insulator, a pair of spaced apart first metal gate layers, and a second metal gate layer. The gate insulator extends along the length of the channel region. The first metal gate layers have a first workfunction and extend from the gate insulator. The second metal gate layer is disposed between the first metal gate layers, has a second workfunction different from the first workfunction, and extends from the gate insulator.

In another embodiment, a method of fabricating a gate stack of a semiconductor device is provided. The semiconductor device includes a pair of spacers that define an accommodating space therebetween. The method comprises partially filling the accommodating space with a gate insulator, depositing a metal gate layer in the accommodating space, and removing the metal gate layer that is between the metal gate layers that are on the spacers.

In another embodiment, a method of fabricating a gate stack of a semiconductor device is provided. The semiconductor device includes a pair of spacers that define an accommodating space therebetween. The method comprises partially filling the accommodating space with a gate insulator, depositing a dummy gate layer in the accommodating space, and removing the dummy gate layer that is between the dummy gate layers that are on the spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a gate stack of a semiconductor device, the method comprising:
   forming a channel that has a channel surface extending in a lateral direction;
   forming first and second spacers that (i) are parallel, (ii) project upward perpendicularly from the channel surface to first and second top ends of the first and second spacers, and (iii) define a first empty space that is bounded by the first and second spacers and by the channel surface;
   partially filling the first empty space with a gate insulator that (i) is laterally bounded by the first and second spacers, (ii) extends upward from the channel surface, (iii) has a top surface that is lower than first and second top ends, and (iv) leaves a second empty space that is bounded by the first and second spacers and the gate insulator's top surface;
   depositing a dummy gate layer in the second empty space, wherein the dummy gate layer includes first and second end sections respectively adjacent the first and second spacers and a middle section laterally between the first and second end sections; and
   removing the middle section to leave a third empty space bounded by the first and second end sections and the gate insulator's top surface;
   substantially filling the third empty space with a second metal gate layer;
   removing the first and second end sections to yield fourth and fifth empty spaces in place of the first and second end sections; and
   substantially filling the fourth and fifth empty spaces with a first metal gate layer that has a workfunction different from a workfunction of the second metal gate layer.

2. The method of claim 1, wherein the first and second end sections have substantially the same laterally-extending thickness.

3. The method of claim 1, wherein the first and second end sections and the middle section have substantially the same laterally-extending thickness.

4. The method of claim 1, wherein the depositing of the dummy gate layer completely fills the second empty space with the dummy gate layer.

5. The method of claim 1, wherein the depositing of the dummy gate layer is performed in a conformal manner.

6. The method of claim 1, wherein substantially filling of fourth and fifth empty spaces results in:
   the first metal gate layer in the fourth empty space having a first rectangular cross-section adjoining the first spacer,
   the first metal gate layer in the fifth empty space having a second rectangular cross-section adjoining the second spacer, and
   the second metal gate layer in the third empty space having a third rectangular cross-section adjoining the first and second rectangular cross-sections.

7. The method of claim 6, wherein the first, second and third rectangular cross sections extend upward from the gate insulator.

8. The method of claim 6, wherein the first, second and third rectangular have a same height.

9. The method of claim 6, wherein the first and second rectangular cross sections have a same laterally-extending width.

10. The method of claim 6, wherein the first, second and third rectangular cross sections have a same laterally-extending width.

11. The method of claim 1, wherein removing the middle section comprises removing the entire middle section but not removing the first and second end sections.

* * * * *